US012249591B2

(12) United States Patent
Jang

(10) Patent No.: US 12,249,591 B2
(45) Date of Patent: Mar. 11, 2025

(54) DISPLAY DEVICE AND METHOD OF MANUFACTURING THE SAME

(71) Applicant: Samsung Display Co., Ltd., Yongin-si (KR)

(72) Inventor: Joo-Nyung Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/338,591

(22) Filed: Jun. 3, 2021

(65) Prior Publication Data
US 2021/0384156 A1 Dec. 9, 2021

(30) Foreign Application Priority Data
Jun. 5, 2020 (KR) .................. 10-2020-0068126

(51) Int. Cl.
*H01L 23/00* (2006.01)
*H01L 25/18* (2023.01)
*H10K 59/131* (2023.01)

(52) U.S. Cl.
CPC .............. *H01L 24/83* (2013.01); *H01L 24/32* (2013.01); *H01L 25/18* (2013.01); *H10K 59/131* (2023.02); *H01L 2224/32145* (2013.01); *H01L 2224/32227* (2013.01); *H01L 2224/83192* (2013.01);
(Continued)

(58) Field of Classification Search
None
See application file for complete search history.

(56) References Cited

U.S. PATENT DOCUMENTS

| 8,576,368 | B2 | 11/2013 | Kim et al. |
| 10,546,203 | B2 | 1/2020 | Lin et al. |
| 10,589,502 | B2 | 3/2020 | Ishimatsu |

(Continued)

FOREIGN PATENT DOCUMENTS

| CN | 103171220 A | * | 6/2013 | ....... G02F 1/133308 |
| CN | 104698689 A | * | 6/2015 | |

(Continued)

OTHER PUBLICATIONS

English translation of foreign reference (Year: 2015).*
(Continued)

*Primary Examiner* — Telly D Green
(74) *Attorney, Agent, or Firm* — CANTOR COLBURN LLP

(57) ABSTRACT

A display device and a manufacturing method thereof are provided. The display device includes a display panel, a circuit board, and a conductive adhesive member. The display panel includes a display area and a non-display area adjacent to the display area. The circuit board overlaps the non-display area and is connected to the display panel. The conductive adhesive member is between and electrically connects the circuit board and the display panel. The circuit board includes: a base layer including a pad area; circuit pads overlapping the pad area and on the base layer, the circuit pads being spaced apart in a plan view and arranged in a direction; and a first resin layer overlapping the pad area and on the base layer. In a plan view, the first resin layer overlaps an area between two adjacent circuit pads and covers side surfaces of the two adjacent circuit pads facing in the direction.

12 Claims, 19 Drawing Sheets

(52) U.S. Cl.
CPC ............... *H01L 2224/83851* (2013.01); *H01L 2224/83862* (2013.01); *H01L 2224/83874* (2013.01)

(56) References Cited

U.S. PATENT DOCUMENTS

| | | | |
|---|---|---|---|
| 10,686,027 B2 * | 6/2020 | Jo | .................. G09G 3/3275 |
| 11,049,924 B2 | 6/2021 | Jang | |
| 11,145,706 B2 * | 10/2021 | Jang | .................. H01L 27/3276 |
| 11,209,875 B2 * | 12/2021 | Jang | .................. G06F 1/189 |
| 2014/0118967 A1 | 5/2014 | Lee et al. | |
| 2017/0338198 A1 * | 11/2017 | Jang | .................. H01L 24/32 |
| 2018/0011369 A1 * | 1/2018 | An | .................. G02B 5/3083 |
| 2018/0033801 A1 * | 2/2018 | Koide | .................. G06F 3/0446 |
| 2018/0301432 A1 * | 10/2018 | Shinohara | .................. H05K 3/323 |
| 2019/0096979 A1 * | 3/2019 | Jo | .................. H10K 50/84 |
| 2020/0034020 A1 * | 1/2020 | Lee | .................. G06F 3/04164 |
| 2020/0312943 A1 * | 10/2020 | Jo | .................. G09G 3/3275 |
| 2020/0403054 A1 * | 12/2020 | Jang | .................. H01L 24/83 |
| 2021/0041922 A1 * | 2/2021 | Jang | .................. G06F 1/181 |
| 2021/0134929 A1 * | 5/2021 | Kim | .................. H01L 27/3276 |
| 2021/0288015 A1 * | 9/2021 | Jang | .................. H01L 24/06 |
| 2021/0375804 A1 * | 12/2021 | Kang | .................. H05K 3/323 |
| 2021/0376043 A1 * | 12/2021 | Kang | .................. H01L 27/3258 |

FOREIGN PATENT DOCUMENTS

| | | |
|---|---|---|
| JP | H06-180459 | 6/1994 |
| JP | 2005-129757 | 5/2005 |
| JP | 2019128418 A * | 8/2019 |
| KR | 10-1309319 | 9/2013 |
| KR | 10-2014-0055001 | 5/2014 |
| KR | 10-2015-0041748 | 4/2015 |
| KR | 10-2017-0130003 | 11/2017 |
| KR | 10-2018-0131496 | 12/2018 |
| KR | 10-2020-0029628 | 3/2020 |
| KR | 1020200032792 A | 3/2020 |
| KR | 10-2020-0145985 | 12/2020 |
| KR | 10-2021-0018700 | 3/2021 |
| WO | WO-2016161719 A1 * | 10/2016 |

OTHER PUBLICATIONS

English translation of foreign reference (Year: 2016).*
Sang-Hoon Lee et al., "Nanofiber Anisotropic Conductive Films (ACF) for Ultra-Fine-Pitch Chip-on-Glass (COG) Interconnections," Journal of Electronic Materials, Sep. 11, 2015, pp. 4628-4636, vol. 44, No. 11, the Minerals, Metals & Materials Society.
Dal-Jin Yoon et al., "Effects of Polyacrylonitrile Anchoring Polymer Layer Solder Anisotropic Conductive Films on the Solder Ball Movement for Fine-Pitch Flex-on-Flex (FOF) Assembly," IEEE Transactions on Components, Packaging and Manufacturing Technology, Apr. 3, 2019, pp. 830-835, vol. 9, No. 5, IEEE.
Dal-Jin Yoon et al., "Effects of the Nylon Anchoring Polymer Layer on the Conductive Particle Movements of Anisotropic Conductive Films for Ultrafine Pitch Chip-on-Glass Applications," IEEE Transactions on Components, Packaging and Manufacturing Technology, Sep. 4, 2018, vol. 8, No. 10, IEEE.

* cited by examiner

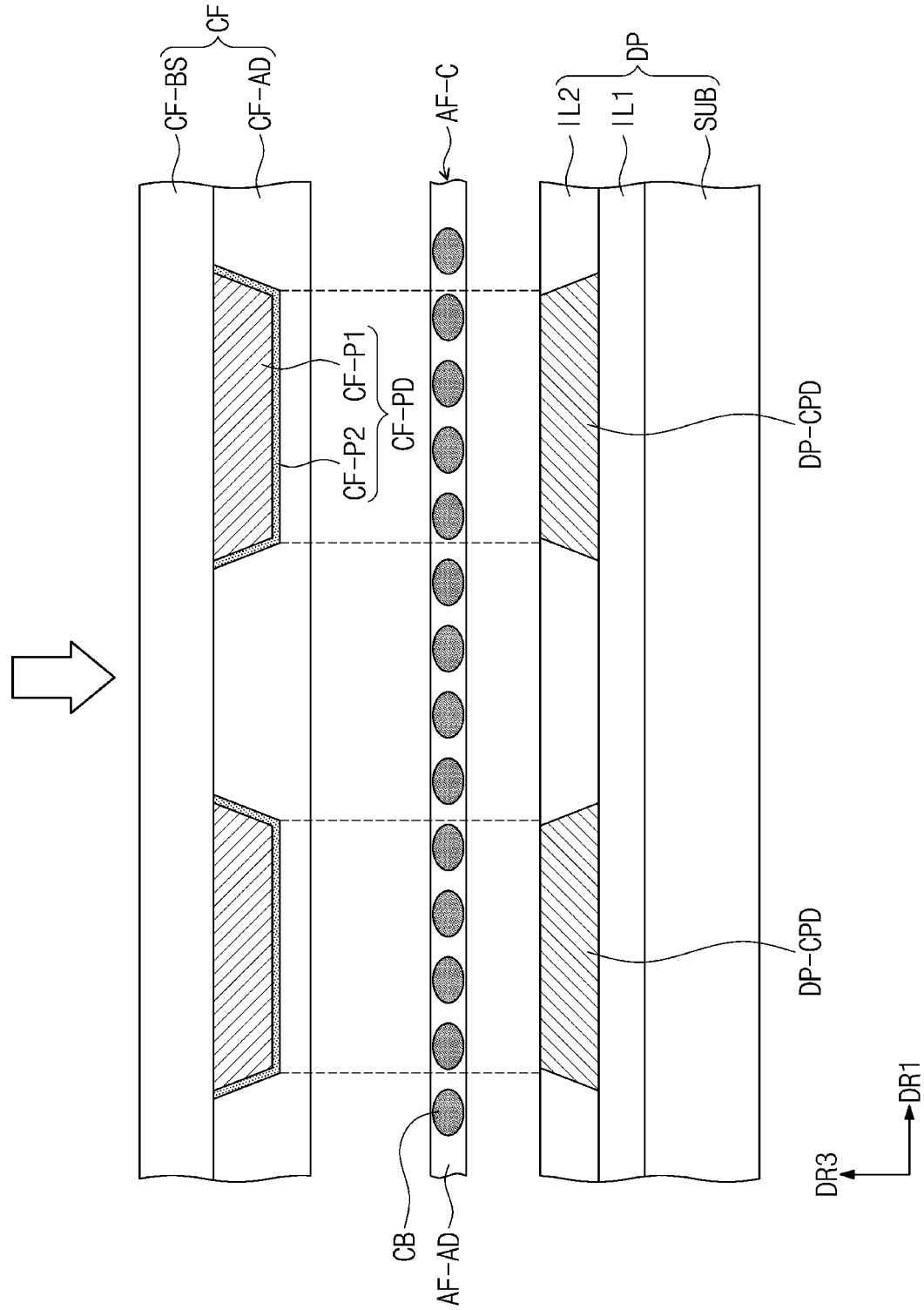

DISPLAY DEVICE AND METHOD OF MANUFACTURING THE SAME

CROSS-REFERENCE TO RELATED APPLICATIONS

This application claims priority to and the benefit of Korean Patent Application No. 10-2020-0068126, filed Jun. 5, 2020, which is hereby incorporated by reference for all purposes as if fully set forth herein.

BACKGROUND

Field

Embodiments generally relate to a display device, and more particularly, to a display device and a manufacturing method thereof.

Discussion

Various display devices used for multimedia devices, such as televisions, mobile phones, tablet computers, navigations, game consoles, and the like, are being developed. A display device includes a display panel for displaying an image. The display panel may include a plurality of gate lines, a plurality of data lines, and a plurality of pixels connected to the plurality of gate lines and the plurality of data lines. The display panel may be connected to a circuit board and electronic components that provide electrical signals for image display to the gate lines and/or the data lines. The circuit board and electronic components may be electrically connected to the display panel through various methods. As an example, a conductive adhesive member may be disposed between a pad of the circuit board and a pad of the display panel so that the circuit board and the display panel can be electrically connected.

The above information disclosed in this section is only for understanding the background of the inventive concepts, and, therefore, may contain information that does not form prior art.

SUMMARY

Some aspects provide a display device capable of improving process efficiency.

Some aspects provide a method of manufacturing a display device capable of improving process efficiency.

Additional aspects will be set forth in the detailed description which follows, and, in part, will be apparent from the disclosure, or may be learned by practice of the inventive concepts.

According to some aspects, a display device includes: a display panel, a circuit board, and a conductive adhesive member. The display panel includes a display area and a non-display area adjacent to the display area. The circuit board overlaps the non-display area and is connected to the display panel. The conductive adhesive member is disposed between the circuit board and the display panel. The conductive adhesive member electrically connects the circuit board and the display panel. The circuit board includes a base layer, circuit pads, and a first resin layer. The base layer includes a pad area. The circuit pads overlap the pad area and are disposed on the base layer. The circuit pads are spaced apart from each other in a plan view and arranged in a direction. The first resin layer overlaps the pad area and is disposed on the base layer. In a plan view, the first resin layer overlaps an area between two adjacent circuit pads among the circuit pads and covers side surfaces of the two adjacent circuit pads facing in the direction.

According to some aspects, a method of manufacturing a display device includes: aligning a circuit board and a display panel such that circuit pads arranged in a direction of the circuit board face driving pads of the display panel, the circuit board includes a first resin layer between two adjacent circuit pads among the circuit pads; placing an adhesive member including a second resin layer and conductive particles in the second resin layer between the circuit pads and the driving pads; and pressing at least one of the circuit board and the display panel such that the first resin layer and the second resin layer contact each other such that the circuit pads and the driving pads become electrically connected to each other via the conductive particles.

According to some aspects, a method of manufacturing a display device includes: placing an adhesive member including a second resin layer and conductive particles in the second resin layer between circuit pads arranged in a direction of a circuit board and driving pads of a display panel, the circuit board including a first resin layer between two adjacent circuit pads among the circuit pads; and pressing at least one of the circuit board and the display panel such that the first resin layer and the second resin layer contact each other and the circuit pads and the driving pads become electrically connected to each other via the conductive particles. Each of the first resin layer and the second resin layer includes either a photoinitiator or a thermal initiator.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts and are incorporated in and constitute a part of this specification, illustrate embodiments of the inventive concepts, and, together with the description, serve to explain principles of the inventive concepts. In the drawings:

FIGS. 9A, 9B, and 9C are views illustrating a display device at various stages of manufacture according to an embodiment;

DETAILED DESCRIPTION OF THE EMBODIMENTS

Figure 1A:
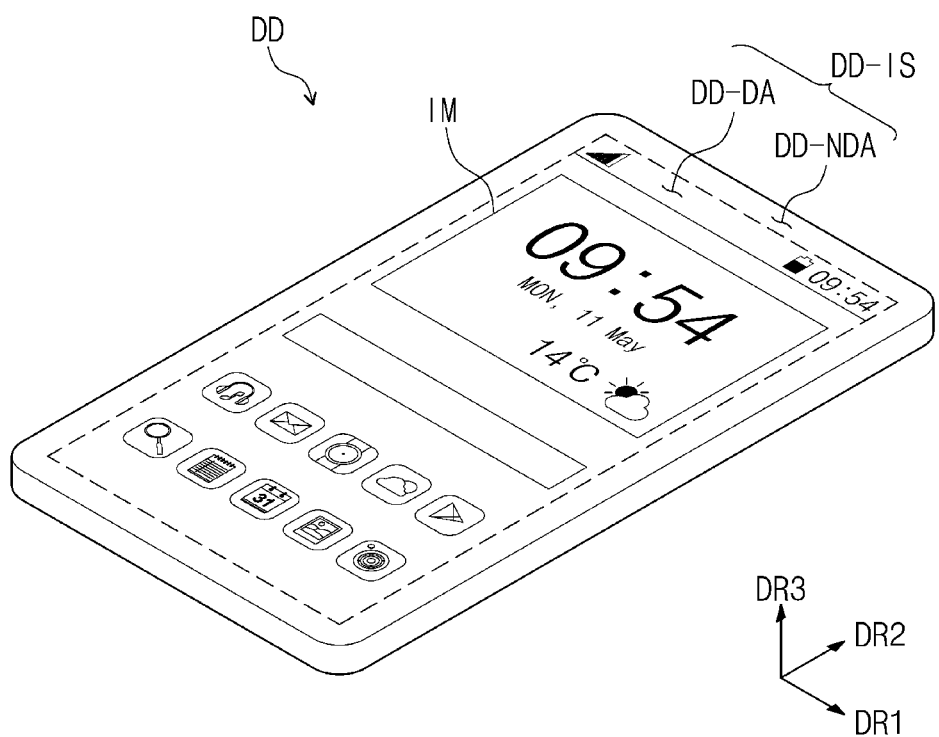
FIG. 1A is a perspective view of a display device according to an embodiment.

In the following description, for the purposes of explanation, numerous specific details are set forth in order to provide a thorough understanding of various embodiments. As used herein, the terms "embodiments" and "implementations" are used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, directly connected to, or directly coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the X-axis, the Y-axis, and the Z-axis are not limited to three axes of a rectangular coordinate system and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

Figure 1B:
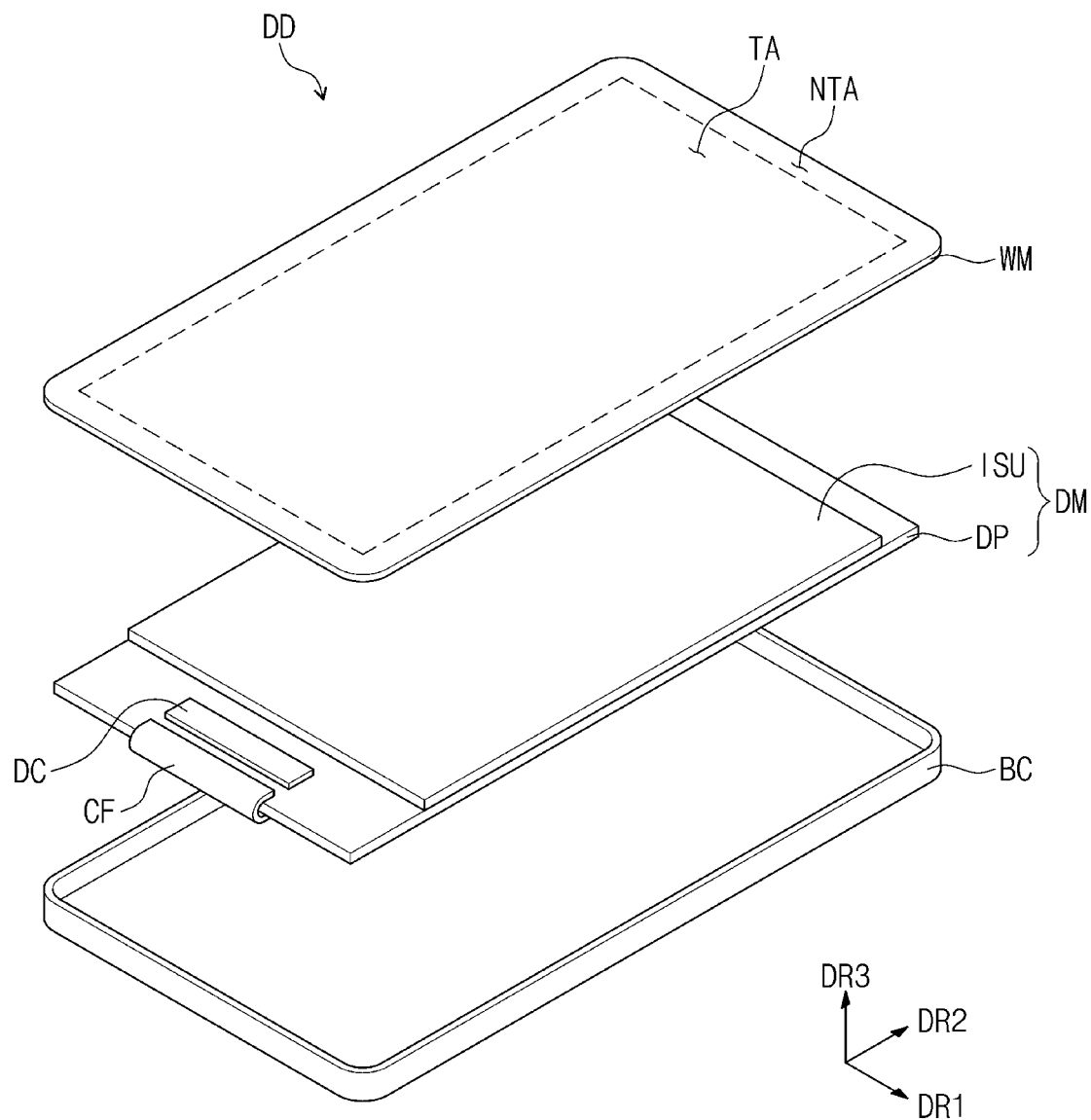
FIG. 1B is an exploded perspective view of a display device according to an embodiment.
Figure 2:
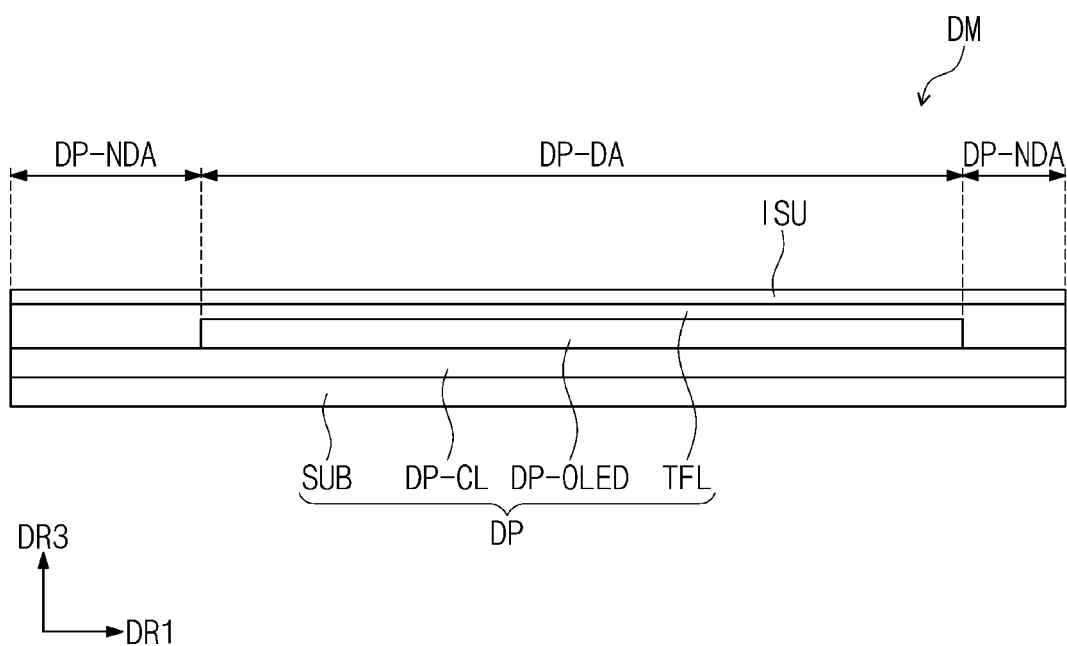
FIG. 2 is a cross-sectional view of a display module according to an embodiment.

FIG. 1A is a perspective view of a display device DD according to an embodiment. FIG. 1B is an exploded perspective view of a display device DD according to an embodiment. FIG. 2 is a cross-sectional view of a display module DM according to an embodiment.

In this specification, the display device DD is shown as being applied to a mobile phone terminal as an example, but embodiments are not limited thereto. Although not shown in the drawings, electronic modules, camera modules, power modules, and/or the like mounted on a main board may be disposed in a bracket/case together with the display device DD to constitute a mobile phone terminal. The display device DD according to some embodiments may be applied to small and medium-sized electronic devices, such as tablets, car navigation units, game consoles, smart watches, etc., in addition to large-sized electronic devices, such as televisions, monitors, billboards, etc.

Referring to FIG. 1A, the display device DD may display an image IM through a display surface DD-IS. FIG. 1A shows icon images as an example of an image IM. The display surface DD-IS is parallel to a plane defined by the first direction DR1 and the second direction DR2. A normal direction of the display surface DD-IS, e.g., a thickness direction of the display device DD, is indicated by a third direction DR3. In this specification, the meaning of "viewed in a plan view" or "being in a plan view" means that an element is viewed in the third direction DR3. The front surface (or the upper surface) and the back surface (or the lower surface) of each of the various layers, units, etc., described below are distinguished by the third direction DR3. However, the directions that the first to third directions DR1, DR2, and DR3 indicate may be converted to other directions, for example, opposite directions, as a relative concept.

The display surface DD-IS includes a display area DD-DA where the image IM is displayed and a non-display area DD-NDA adjacent to the display area DD-DA. The non-display area DD-NDA may be an area where the image IM is not displayed. However, embodiments are not limited thereto. For instance, the non-display area DD-NDA may be adjacent to or omitted from one side of the display area DD-DA.

Referring to FIG. 1B, the display device DD may include a window WM, a display module DM, a driving chip DC, a circuit board CF, and a storage member BC. The storage member BC accommodates the display module DM and may be combined with (or coupled to) the window WM.

The window WM is disposed on the display module DM and can transmit an image, such as image IM, provided from the display module DM to the outside. The window WM includes a transmission area TA and a non-transmission area NTA. The transmission area TA overlaps the display area DD-DA and may have a shape corresponding to the display area DD-DA. The image IM displayed on the display area DD-DA of the display device DD may be viewed from the outside through the transmission area TA of the window WM.

The non-transmission area NTA overlaps the non-display area DD-NDA and may have a shape corresponding to the non-display area DD-NDA. The non-transmission area NTA may be an area having a relatively low light transmittance compared to the transmission area TA. However, embodiments are not limited to such a configuration. For instance, the non-transmission area NTA may be omitted.

The window WM may be made of at least one of glass, sapphire, and plastic, but embodiments are not limited thereto. Further, although the window WM is shown as a single layer, the window WM may include a plurality of layers. The window WM may include a base layer and at least one printed layer that overlaps the non-transmission area NTA and is disposed on a back surface of the base layer. The printed layer may have a predetermined color. For example, the printed layer may be provided in a black color or may be provided in a color other than black color.

The display module DM is disposed between the window WM and the storage member BC. The display module DM includes a display panel DP and an input detection layer ISU. The display panel DP generates an image, e.g., the image IM, and may deliver the generated image to (or through) the window WM.

According to an embodiment, the display panel DP may be a light emitting display panel, but the kind (or type) of the display panel DP is not particularly limited. For example, the display panel DP may be an organic light emitting display panel, a quantum dot light emitting display panel, etc. A light emitting layer of an organic light emitting display panel may include an organic light emitting material. The light emitting layer of a quantum dot light emitting display panel may include one or more quantum dots, quantum rods, and/or the like. In addition, although the display panel DP is shown as having a rigid property, the display panel DP may have a flexible property such that the display panel DP can be folded along a folding axis or curved along at least one direction.

Hereinafter, the display panel DP will be described as being an organic light emitting display panel. However, embodiments are not limited thereto, and various display panels may be applied in association with at least one embodiment.

Referring to FIG. 2, the display panel DP includes a substrate SUB, and a circuit element layer DP-CL, a display element layer DP-OLED, and an encapsulation layer TFL disposed on the substrate SUB.

The display panel DP includes a display area DP-DA and a non-display area DP-NDA. The display area DP-DA of the display panel DP may correspond to the display area DD-DA shown in FIG. 1A or the transmission area TA shown in FIG. 1B. The non-display area DP-NDA may correspond to the non-display area DD-NDA shown in FIG. 1A or the non-transmission area NTA shown in FIG. 1B.

The substrate SUB may include at least one plastic film. In some embodiments, the substrate SUB may include a plastic substrate, a glass substrate, a metal substrate, or an organic/inorganic composite material substrate as a flexible substrate. The substrate SUB may be a member that generally supports components of the display panel DP, and in this specification, the substrate SUB may be described as a display substrate.

The circuit element layer DP-CL includes at least one intermediate insulating layer and one or more circuit elements. The intermediate insulating layer includes at least one intermediate inorganic film and at least one intermediate organic film. A circuit element may include signal lines, a pixel driving circuit of a pixel, and the like.

The display element layer DP-OLED includes at least organic light emitting diode. The display element layer DP-OLED may further include an organic layer, such as a pixel definition layer. According to an embodiment, when the display panel is provided as a liquid crystal display panel, the display element layer may be include a liquid crystal layer.

A encapsulation layer TFL seals the display element layer DP-OLED. For example, the encapsulation layer TFL may be a thin film sealing layer. The encapsulation layer TFL protects the display element layer DP-OLED from foreign matter, such as moisture, oxygen, dust particles, etc. However, embodiments are not limited thereto, and a sealing substrate may be provided in place of (or in addition to) the encapsulation layer TFL. In this case, the sealing substrate may face the substrate SUB, and a circuit element layer DP-CL and a display element layer DP-OLED may be disposed between the sealing substrate and the substrate SUB.

Referring to FIG. 2, the encapsulation layer TFL is shown as being overlapped on the display area DP-DA, but is not limited thereto. For instance, the encapsulation layer TFL may partially overlap the non-display area DP-NDA.

The input detection layer ISU may be disposed between the window WM and the display panel DP. The input detection layer ISU detects an input applied from the outside. The externally applied input may be provided in various forms. For example, the external input includes various types of external inputs such as a part of the user's body, a stylus pen, light, heat, or pressure. Also, an input that a part of the body, such as a user's hand, touches, as well as a close or adjacent spatial touch (e.g., hovering) may be a form of input.

The input detection layer ISU may be directly disposed on the display panel DP. In this specification, "A configuration is directly disposed on B configuration" means that no adhesive layer is disposed between A configuration and B configuration. In some embodiments, the input detection layer ISU may be manufactured with the display panel DP by a continuous process. However, embodiments are not limited thereto. For example, the input detection layer ISU may be provided as a separate panel and may be combined with the display panel DP through an adhesive layer. As another example, the input detection layer ISU may be omitted.

Referring to FIG. 1B again, the driving chip DC overlaps the non-display area DP-NDA and may be disposed on the display panel DP. For example, the driving chip DC may generate a driving signal for the operation of the display panel DP based on a control signal transmitted from the circuit board CF. The driving chip DC may transmit the generated driving signal to the circuit element layer DP-CL of the display panel DP.

The circuit board CF is electrically connected to the display module DM. As shown in FIG. 1B, the circuit board CF is shown as being connected to the display panel DP, but the circuit board CF may be electrically connected to each of the display panel DP and the input detection layer ISU.

According to an embodiment, each of the circuit board CF and the driving chip DC may be electrically connected to the display panel DP through a conductive adhesive member. For example, a conductive adhesive member may be disposed between the circuit board CF and the display panel DP, and the circuit board CF and the display panel DP may be electrically connected through a plurality of conductive particles included in the conductive adhesive member.

Figure 3:
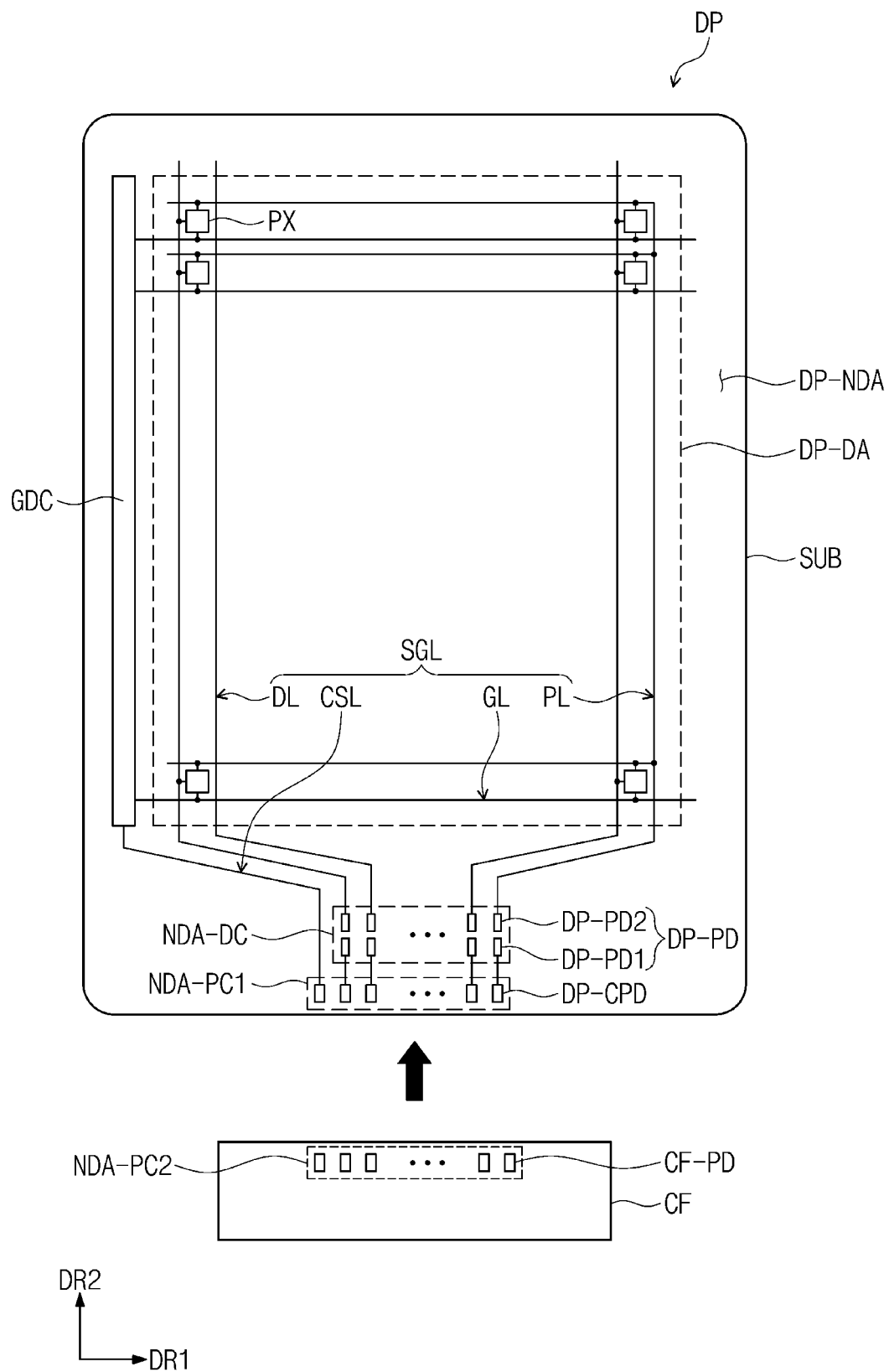
FIG. 3 is a plan view of a display panel according to an embodiment.

FIG. 3 is a plan view of a display panel DP according to an embodiment.

Referring to FIG. 3, the display panel DP may include a driving circuit GDC, a plurality of signal lines SGL, a plurality of first driving pads DP-PD, a plurality of second driving pads DP-CPD, and a plurality of pixels PX (hereinafter referred to as pixels). The pixels PX are arranged in the display area DP-DA. Each of the pixels PX includes an organic light emitting diode and a pixel driving circuit connected thereto. The driving circuit GDC, the signal lines SGL, the first driving pads DP-PD, the second driving pads DP-CPD, and the pixel driving circuit may be included in the circuit element layer DP-CL shown in FIG. 2.

The driving circuit GDC outputs (e.g., sequentially outputs) gate signals to the plurality of gate lines GL. The driving circuit GDC may further output another control signal to the pixels PX. The driving circuit GDC may include a plurality of thin film transistors formed through a same process as the pixel driving circuit of the pixels PX, for example, a low temperature polycrystalline silicon (LTPS) process, a low temperature polycrystalline oxide (LTPO) process, and/or the like.

The signal lines SGL include gate lines GL, data lines DL, a power line PL, and a control signal line CSL. The gate lines GL are respectively connected to corresponding pixels PX among the pixels PX, and the data lines DL are respectively connected to corresponding pixels PX among the pixels PX. The power line PL is connected to the pixels PX. The control signal line CSL may provide control signals to the driving circuit GDC.

The signal lines SGL overlap the display area DP-DA and the non-display area DP-NDA. Each of the signal lines SGL may include a pad part and a line part. The line part overlaps the display area DP-DA and the non-display area DP-NDA.

The pad part is connected to the end of the line part. The pad part is disposed in the non-display area DP-NDA and overlaps the corresponding signal pad among the first driving pads DP-PD.

Hereinafter, in this specification, the area in which the first driving pads DP-PD are disposed among the portions of the non-display area DP-NDA may be defined as a chip area NDA-DC, and the area in which the second driving pads DP-CPD are disposed may be defined as the first pad area NDA-PC1.

According to an embodiment, the driving chip DC shown in FIG. 1B may be mounted on the chip area NDA-DC. The first driving pads DP-PD are electrically connected to the driving chip DC to transmit electrical signals received from the driving chip DC to the signal lines SGL.

The first driving pads DP-PD include first row pads DP-PD1 arranged in the first row along the first direction DR1, and second row pads DP-PD2 arranged in the second row along the first direction DR1. However, embodiments are not limited thereto. For example, the first driving pads DP-PD may be arranged in one row or in a plurality of rows along the first direction DR1.

Any part of the circuit board CF may be disposed on the first pad area NDA-PC1. The second driving pads DP-CPD are electrically connected to the circuit board CF to transmit electrical signals received from the circuit board CF to the first driving pads DP-PD. The circuit board CF can be rigid and/or flexible. For example, when the circuit board CF is flexible, it may be provided as a flexible printed circuit board.

The circuit board CF may include a timing control circuit that controls the operation of the display panel DP. The timing control circuit may be mounted on the circuit board CF in the form of an integrated chip. In addition, although not shown, the circuit board CF may include an input detection circuit for controlling the input detection layer ISU.

The circuit board CF may include circuit pads CF-PD electrically connected to the display panel DP. The circuit pads CF-PD may be disposed in the second pad area NDA-PC2 defined in (or on) the circuit board CF.

Although the display panel DP has been described as a structure including the first driving pads DP-PD for mounting the driving chip DC shown in FIG. 1B, embodiments are not limited thereto. The driving chip DC may be mounted on the circuit board CF. In this case, the first driving pads DP-PD may be omitted.

Figure 4:
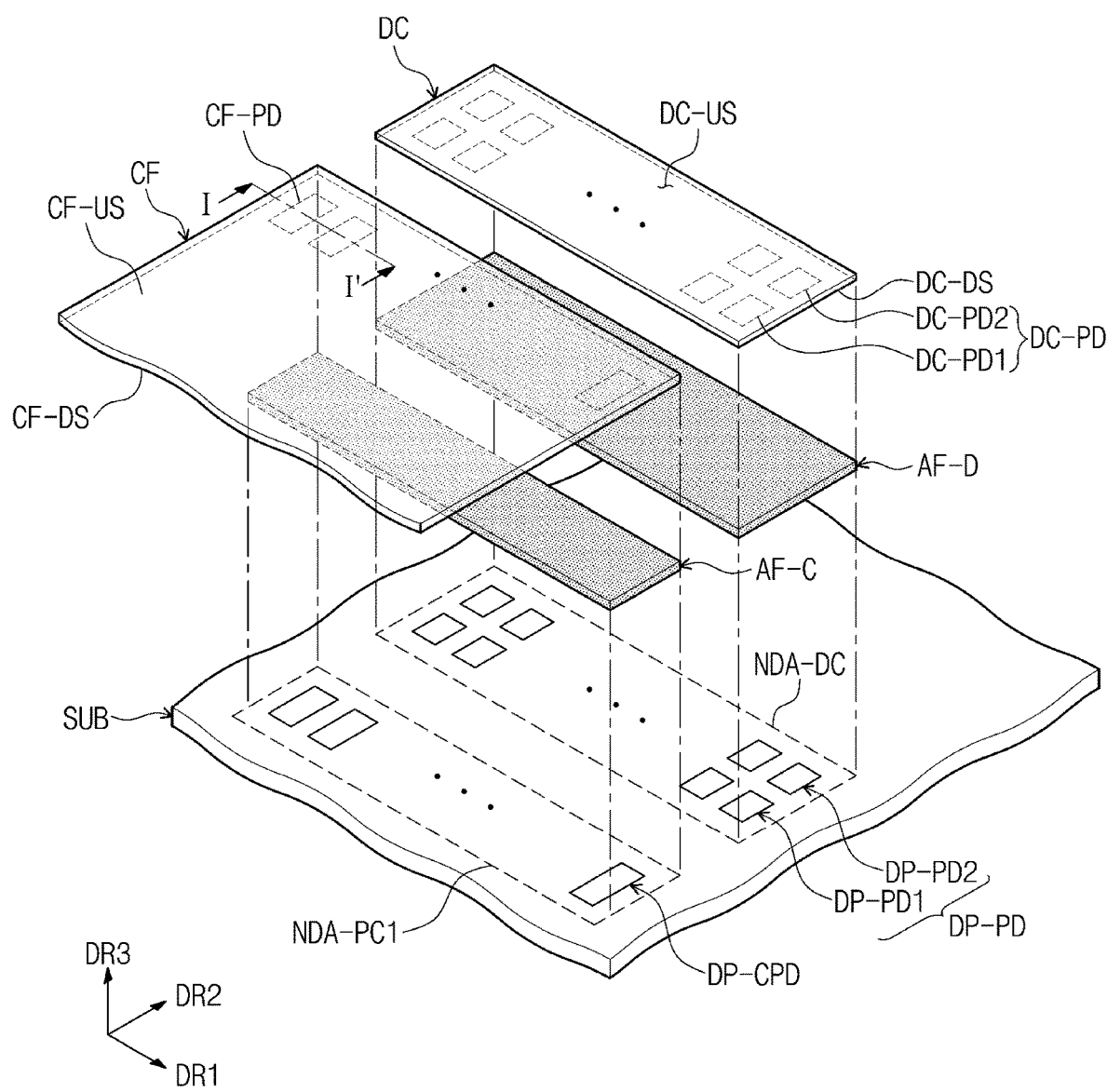
FIG. 4 is an exploded perspective view of a display device according to an embodiment.
Figure 5:
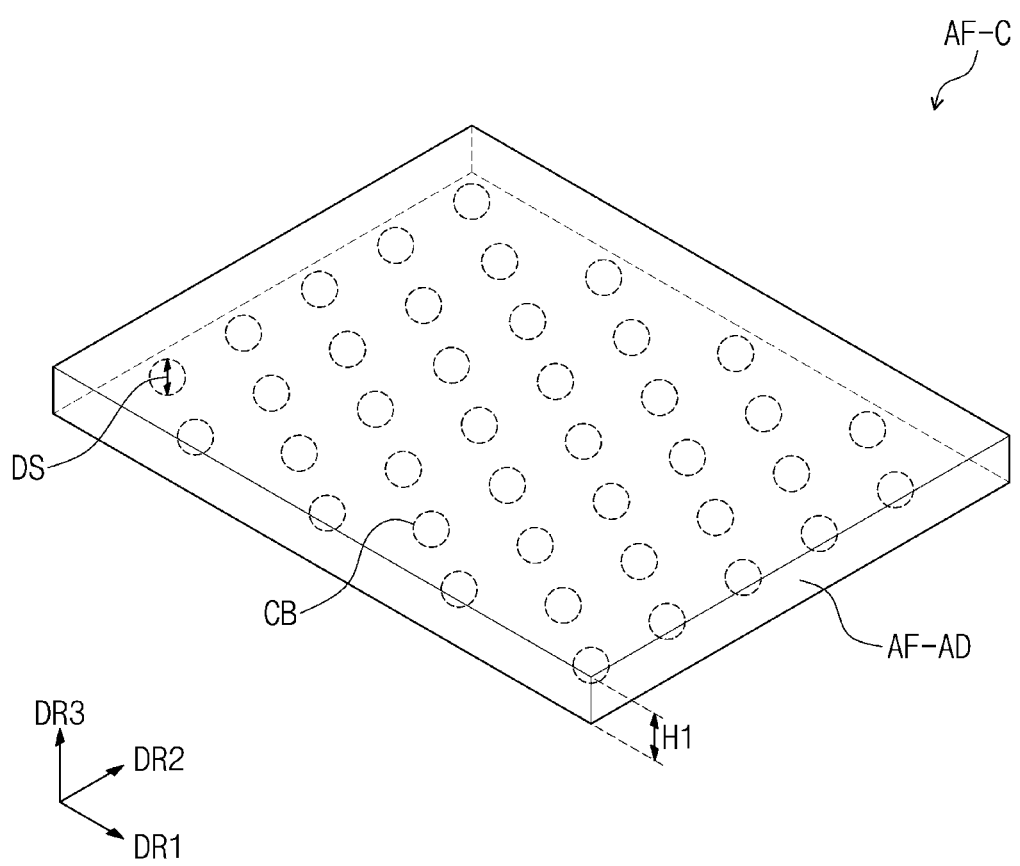
FIG. 5 is a perspective view of a conductive adhesive member according to an embodiment.

FIG. 4 is an exploded perspective view of a display device DD according to an embodiment. FIG. 5 is a perspective view of a first conductive adhesive member AF-C according to an embodiment.

Referring to FIG. 4, the display device DD includes a first conductive adhesive member AF-C disposed between the circuit board CF and the substrate SUB of the display panel DP, and a second conductive adhesive member AF-D disposed between the driving chip DC and the substrate SUB of the display panel DP. The first conductive adhesive member AF-C electrically connects the circuit board CF and the display panel DP, and the second conductive adhesive member AF-D electrically connects the driving chip DC and the display panel DP.

The circuit board CF includes an upper surface CF-US and a lower surface CF-DS. The lower surface CF-DS of the circuit board CF may be a surface facing the display panel DP. The circuit pads CF-PD are disposed on the lower surface CF-DS of the circuit board CF and may be electrically connected to the second driving pads DP-CPD of the display panel DP, respectively. The circuit pads CF-PD and the second driving pads DP-CPD may be electrically connected to each other through a first conductive adhesive member AF-C. The circuit pads CF-PD may contact the upper surface of the first conductive adhesive member AF-C, and the second driving pads DP-CPD may contact the lower surface of the first conductive adhesive member AF-C.

The driving chip DC includes an upper surface DC-US and a lower surface DC-DS. The lower surface DC-DS of the driving chip DC may be a surface facing the display panel DP. The driving chip DC includes chip pads DC-PD that are electrically connected to the first driving pads DP-PD disposed on the substrate SUB, respectively. The chip pads DC-PD include first row chip pads DC-PD1 arranged in the first row along the first direction DR1, and second row chip pads DC-PD2 arranged in the second row along the first direction DR1. The first row chip pads DC-PD1 and the second row chip pads DC-PD2 may have a shape exposed to the outside from the lower surface DC-DS of the driving chip DC.

In this specification, the chip pads DC-PD are described as being arranged in two rows, but the chip pads DC-PD may be arranged in a single row or a plurality of rows based on the structure in which the first driving pads DP-PD are arranged.

The chip pads DC-PD and the first driving pads DP-PD may be electrically connected to each other through a second conductive adhesive member AF-D. The chip pads DC-PD may contact the upper surface of the second conductive adhesive member AF-D, and the circuit pads CF-PD of the circuit board CF may contact the upper surface of the first conductive adhesive member AF-C.

Referring to FIG. 5, a first conductive adhesive member AF-C disposed between a circuit board CF and a substrate SUB of a display panel DP is shown. Although not shown in the drawing, the structure of the second conductive adhesive member AF-D may also have substantially the same structure as the first conductive adhesive member AF-C shown in FIG. 5.

The first conductive adhesive member AF-C includes a resin layer AF-AD and a plurality of conductive particles CB dispersed in the resin layer AF-AD. For example, the conductive particles CB are contained in the resin layer AF-AD. The circuit pads CF-PD and the second driving pads DP-CPD are respectively contacted to the conductive particles CB so that the circuit pads CF-PD and the second driving pads DP-CPD may be electrically connected to each other.

According to some embodiments, the resin layer AF-AD may be an adhesive resin including a photoinitiator or a thermal initiator. For example, the resin layer AF-AD including the photoinitiator may be activated by ultraviolet rays, and the resin layer AF-AD including the thermal initiator may be activated by external heat.

The conductive particles CB are spaced apart from each other and may be divided into a plurality of conductive groups arranged in the first direction DR1. Each of the conductive groups may include a plurality of conductive particles CB arranged in the second direction DR2.

According to some embodiments, the conductive groups have an aligned structure and can be arranged in the resin layer AF-AD. The conductive groups may have a structure overlapping each other in the first direction DR1. For instance, on the cross-section of the resin layer AF-AD, conductive particles CB of different conductive groups may have a structure overlapping each other in the first direction DR1. Accordingly, each of the plurality of conductive particles CB dispersed in the resin layer AF-AD may be located at the same height from the lower surface of the resin layer AF-AD.

Further, each of the conductive particles CB may have a diameter of the first length DS. The resin layer AF-AD in which the conductive particles CB are dispersed may be provided as a film type having a constant thickness H1. According to some embodiments, the thickness H1 of the resin layer AF-AD may have a thickness of 0.5 times or more and 2.0 times or less than the diameter length, e.g., first length DS, of each of the conductive particles CB.

By providing the thickness H1 of the resin layer AF-AD based on the above conditions, during the bonding of the circuit pads CF-PD and the second driving pads DP-CPD, the arrangement of the conductive particles CB can be prevented from being irregular.

In some embodiments, during the bonding of the circuit pads CF-PD and the second driving pads DP-CPD, the upper and lower surfaces of the resin layer AF-AD may be pressed by the circuit pads CF-PD and the second driving pads DP-CPD, respectively. In this case, the arrangement of the conductive particles CB included in the resin layer AF-AD may also be changed by the pressure applied to the resin layer AF-AD. For example, by pressing the resin layer AF-AD, two adjacent conductive groups in the first direction DR1 among the conductive groups may be moved close to each other. In this case, a short circuit may be caused between two circuit pads CF-PD or two second driving pads DP-CPD receiving different signals.

However, as the resin layer AF-AD according to various embodiments may be provided with a thickness of 0.5 times or more and 2.0 times or less than the diameter of the first length DS of each of the conductive particles CB, even when the resin layer AF-AD is pressed, the conductive particles CB may be prevented from moving in the first direction DR1. Thus, as pressure is applied to the conductive particles CB according to the pressure of the resin layer AF-AD (hereinafter referred to as a second resin layer AF-AD), the conductive particles CB may be pinned down between the circuit pads CF-PD and the second driving pads DP-CPD. As a result, a short circuit between two circuit pads CF-PD or two second driving pads DP-CPD receiving different signals can be prevented.

Figure 6A:
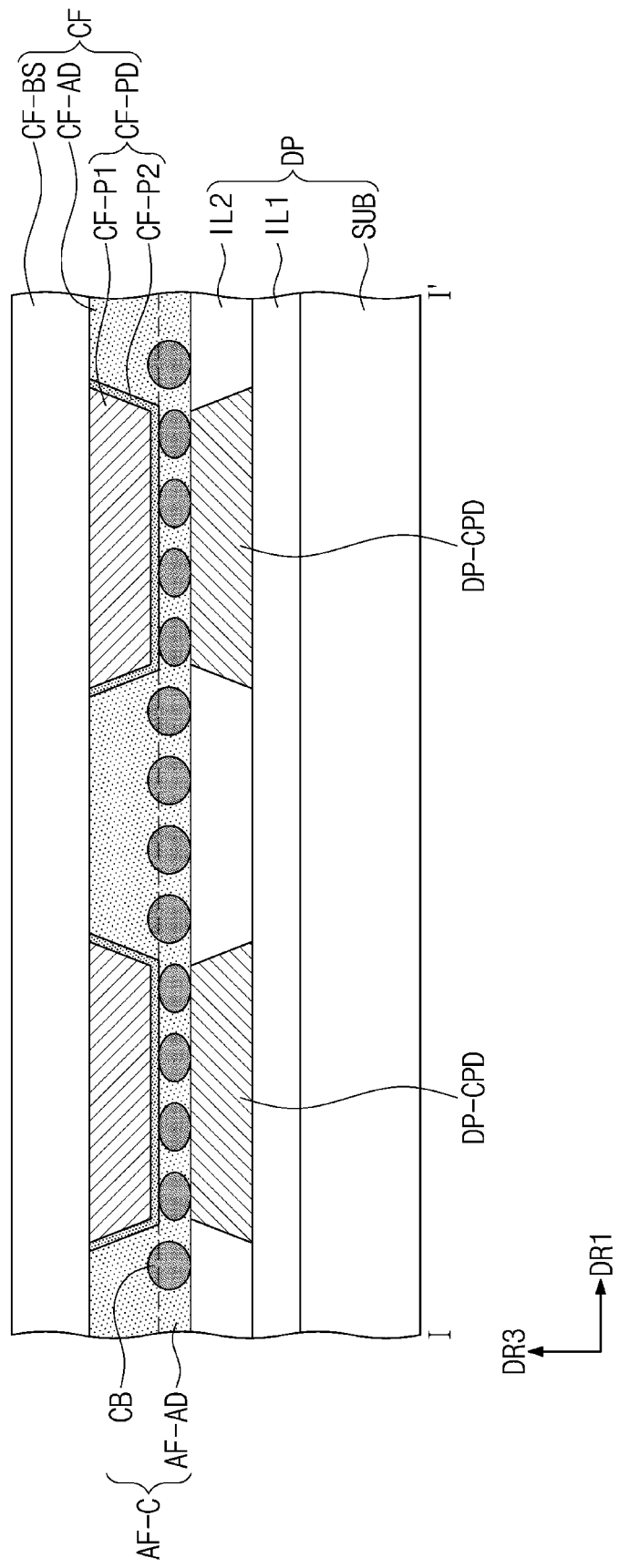
FIG. 6A is a cross-sectional view taken along sectional line I-I' shown in FIG. 4 according to an embodiment.
Figure 6B:
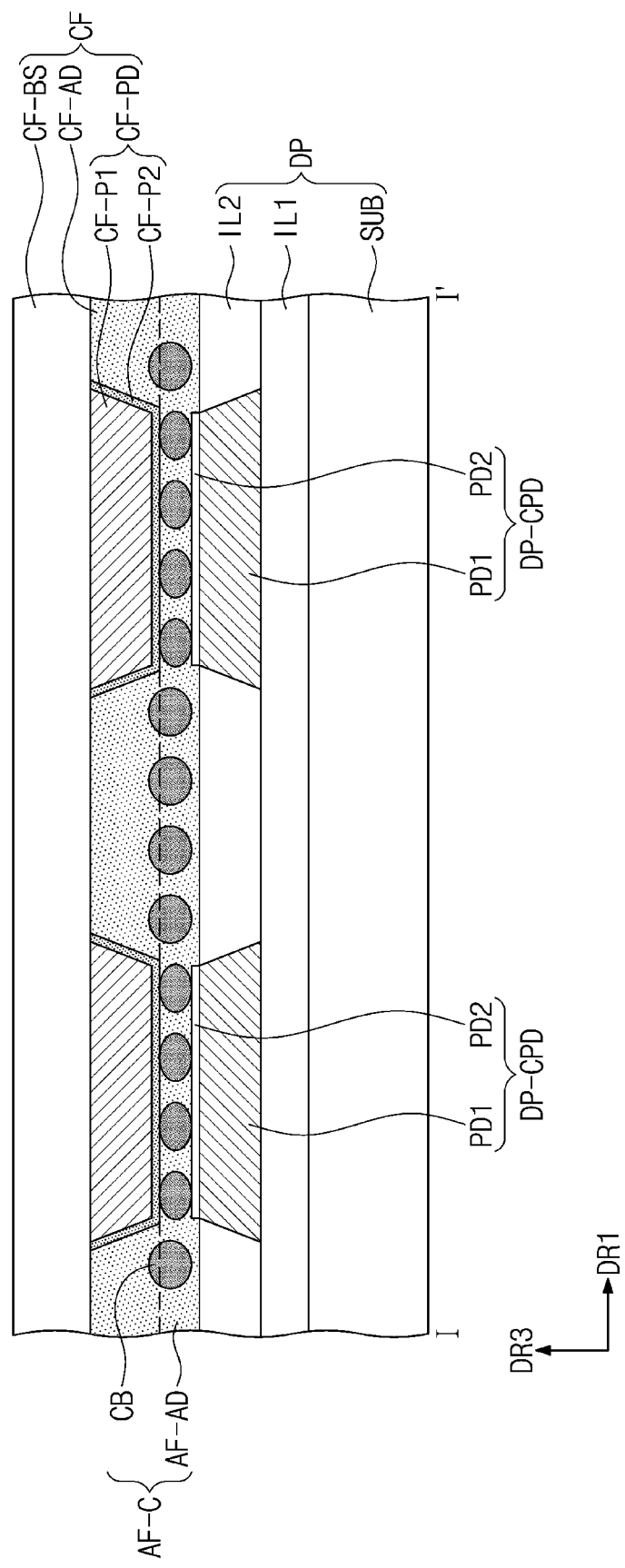
FIG. 6B is a cross-sectional view taken along sectional line I-I' shown in FIG. 4 according to an embodiment.

FIG. 6A is a cross-sectional view taken along sectional line I-I' shown in FIG. 4 according to an embodiment. FIG. 6B is a cross-sectional view taken along sectional line I-I' shown in FIG. 4 according to an embodiment.

FIG. 6A illustrates a structure in which circuit pads CF-PD of a circuit board CF and second driving pads DP-CPD of a display panel DP are bonded. In addition, FIG. 6A shows two second driving pads DP-CPD among the second driving pads DP-CPD shown in FIG. 4, and two circuit pads CF-PD electrically connected thereto, respectively. The two circuit pads CF-PD are electrically insulated and may receive other electrical signals.

Referring to FIG. 6A, the circuit board CF includes a base layer CF-BS, circuit pads CF-PD, and a first resin layer CF-AD. Although not shown in the drawing, an insulating layer may be further disposed on the base layer CF-BS. For example, the insulating layer may be disposed between the base layer CF-BS and the circuit pads CF-PD. The first resin layer CF-AD may be an adhesive resin including a photoinitiator or a thermal initiator. For example, the first resin layer CF-AD including the photoinitiator may be activated by ultraviolet rays, and the first resin layer CF-AD including the thermal initiator may be activated by external heat.

The circuit pads CF-PD include a first circuit pad CF-P1 disposed on the base layer CF-BS and a second circuit pad CF-P2 covering the first circuit pad CF-P1 and disposed on the base layer CF-BS. The second circuit pad CF-P2 may have a smaller thickness than the first circuit pad CF-P1. In some embodiments, the first circuit pad CF-P1 may be copper (Cu), and the second circuit pad CF-P2 may be tin (Sn). The second circuit pad CF-P2 may prevent the first circuit pad CF-P1 made of copper from being oxidized with the outside.

According to some embodiments, the first resin layer CF-AD may be disposed between two adjacent circuit pads CF-PD among the plurality of circuit pads CF-PD illustrated in FIG. 4. As illustrated in FIG. 6A, the first resin layer CF-AD may have a structure that is entirely disposed in a space between two circuit pads CF-PD facing in the first direction DR1.

The first resin layer CF-AD may have a thickness that is thinner than, identical to, or greater than the thickness of the circuit pads CF-PD along the third direction DR3 according to the thickness of the second resin layer AF-AD. Through this, the first resin layer CF-AD has a structure in contact with each of the side surfaces of the circuit pads CF-PD facing each other in the first direction DR1 and the base layer CF-BS and for example, the first resin layer CF-AD may entirely cover the side surfaces of the circuit pads CF-PD.

The display panel DP includes a substrate SUB described with reference to FIG. 2, first and second insulating layers IL1 and IL2 disposed on the substrate SUB, and second driving pads DP-CPD (hereinafter referred to as driving pads DP-CPD).

According to some embodiments, at least one insulating layer may be disposed between the driving pads DP-CPD and the substrate SUB. For example, the first insulating layer IL1 and the second insulating layer IL2 stacked on the substrate SUB are illustrated in FIG. 6A. The driving pads DP-CPD may be disposed on the first insulating layer IL1. The second insulating layer IL2 exposes the driving pads DP-CPD to the outside and may be disposed on the first insulating layer IL1.

The driving pads DP-CPD may include any one of a metal and a transparent conductive layer. For instance, the transparent conductive layer may include at least one of indium tin oxide (ITO), indium zinc oxide (IZO), zinc oxide (ZnO), indium tin zinc oxide (ITZO), PEDOT, metal nano wire, and graphene. The metal may include at least one of molybdenum, silver, titanium, copper, aluminum, alloys thereof, and the like.

Although the driving pads DP-CPD are described as having a single configuration including any one of a metal and a transparent conductive layer through FIG. 6A, embodiments are not limited thereto. For example, as shown in FIG. 6B, each of the driving pads DP-CPD may include two stacked first pads PD1 and second pads PD2. The first pad PD1 may be provided as metal and the second pad PD2 may be provided as a transparent conductive layer. In this case, the second pad PD2 may be disposed on the first pad PD1.

Referring back to FIG. 6A, the circuit pads CF-PD and the driving pads DP-CPD may be electrically bonded to each other through the conductive particles CB of the first conductive adhesive member AF-C. As described in association with FIG. 5, the second resin layer AF-AD of the first conductive adhesive member AF-C may have a thickness of 0.5 times to 2.0 times the diameter of the individual conductive particles CB. Meanwhile, when the first resin layer CF-AD of the circuit board CF is omitted, an inner space may be defined between the second resin layer AF-AD and the base layer CF-BS of the circuit board CF.

According to an embodiment, the inner space may be filled by the first resin layer CF-AD of the circuit board CF. In this case, the first resin layer CF-AD may have a larger thickness than the second resin layer AF-AD.

For instance, when the circuit pads CF-PD and driving pads DP-CPD are bonded, the first resin layer CF-AD and the second resin layer AF-AD are provided as one adhesive layer. That is, the first resin layer CF-AD and the second resin layer AF-AD have a structure in contact with each other, and the circuit board CF and the display panel DP can be generally fixed. The first resin layer CF-AD is fixed to the base layer CF-BS and the circuit pads CF-PD of the circuit board CF, and the second resin layer AF-AD may be fixed to the second insulating layer IL2. In addition, the first resin layer CF-AD is fixed to the base layer CF-BS and the circuit pads CF-PD of the circuit board CF, and the second resin layer AF-AD may also be fixed on the first resin layer CF-AD.

Further, even after the circuit pads CF-PD and the driving pads DP-CPD are bonded, the conductive particles CB may have a structure overlapping each other in the first direction DR1. In this manner, as the aligned structure of the conductive particles CB is maintained, short circuits between the circuit pads CF-PD and/or the driving pads DP-CPD can be prevented.

As described above, as the circuit board CF according to various embodiments includes a first resin layer CF-AD that adheres to the first conductive adhesive member AF-C, the bonding process between the circuit board CF and the display panel DP may be easier. When the first resin layer CF-AD of the circuit board CF is omitted, after the bonding process of the circuit pads CF-PD and the driving pads DP-CPD, a process of filling the inner space with an adhesive layer and a process of curing the same are performed. However, in various embodiments, as the circuit board CF is provided with a structure including the first resin layer CF-AD, after the bonding process of the circuit pads CF-PD and the driving pads DP-CPD, a process of filling the inner space with an adhesive layer may be omitted. As a result, the overall process efficiency of the display device DD can be improved.

Figure 7A:
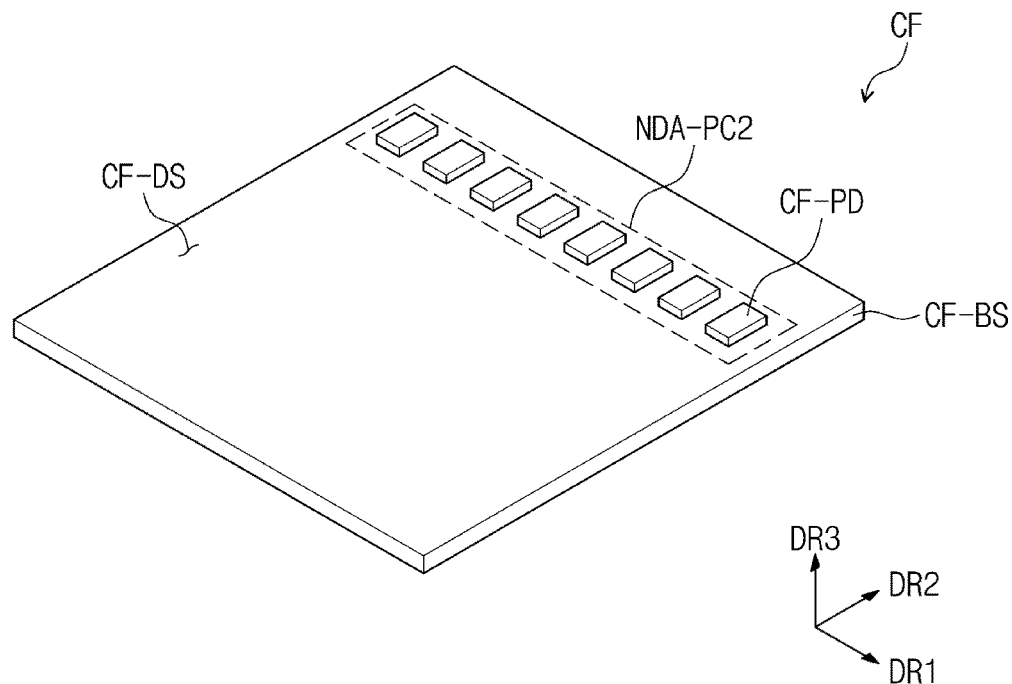
FIGS. 7A and 7B are perspective views of a circuit board according to some embodiments.
Figure 7B:
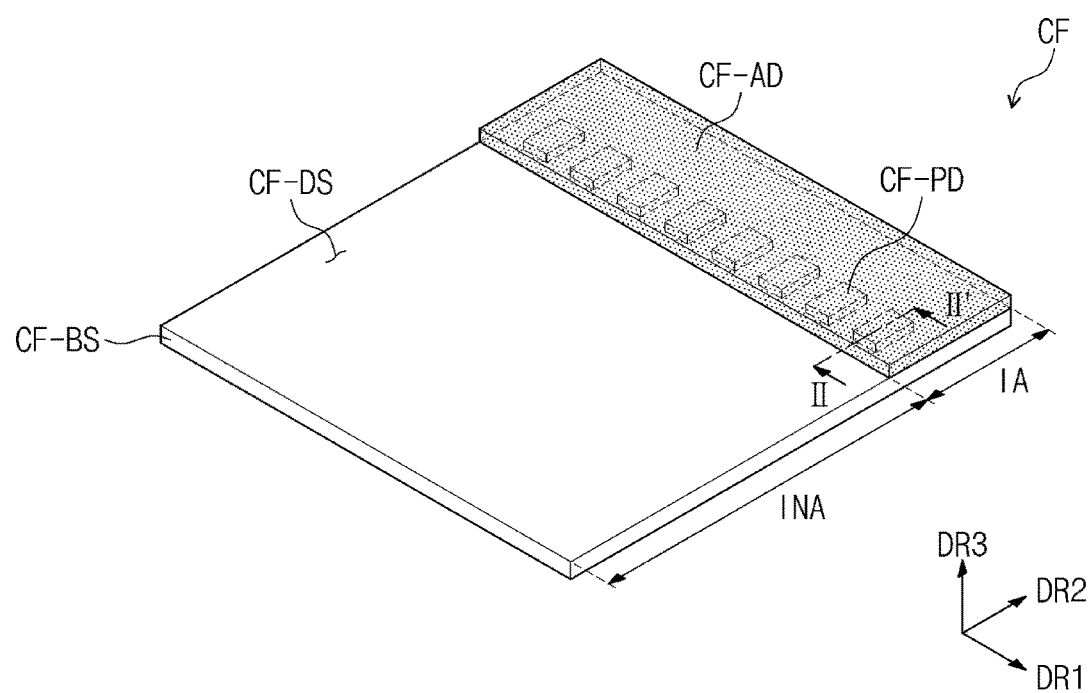
Figure 8A:
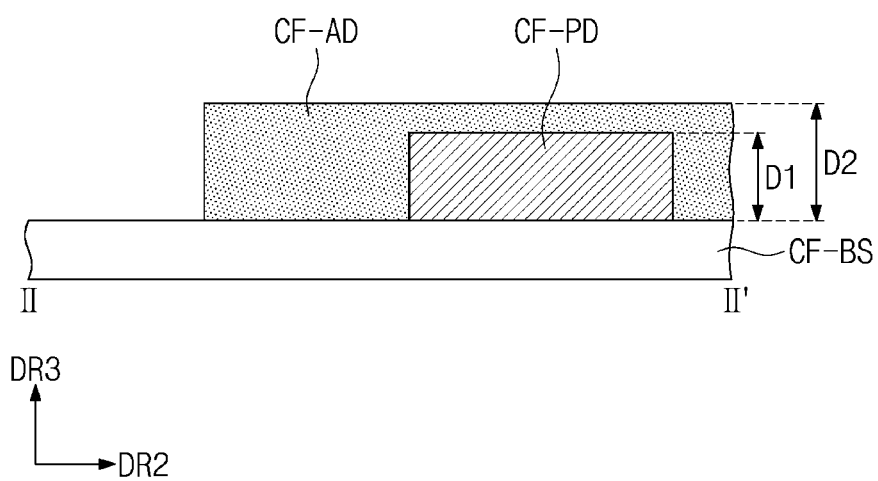
FIG. 8A is a cross-sectional view taken along sectional line II-II' shown in FIG. 7B according to an embodiment.
Figure 8B:
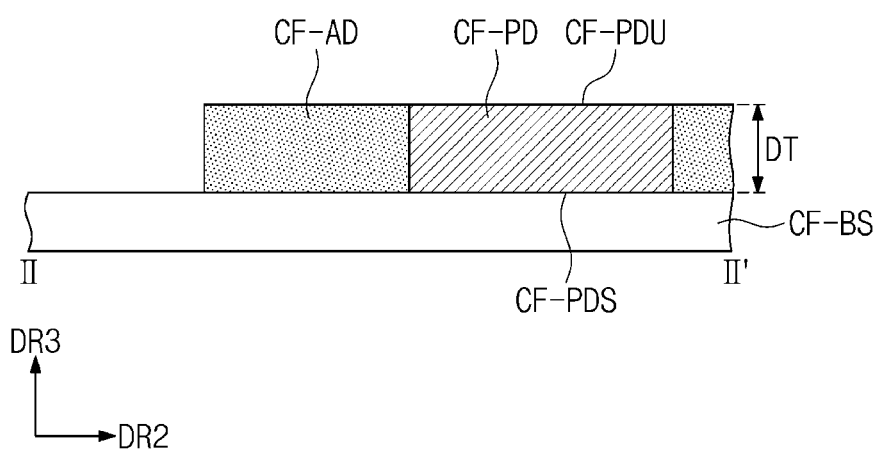
FIG. 8B is a cross-sectional view taken along sectional line II-II' shown in FIG. 7B according to an embodiment.
Figure 8C:
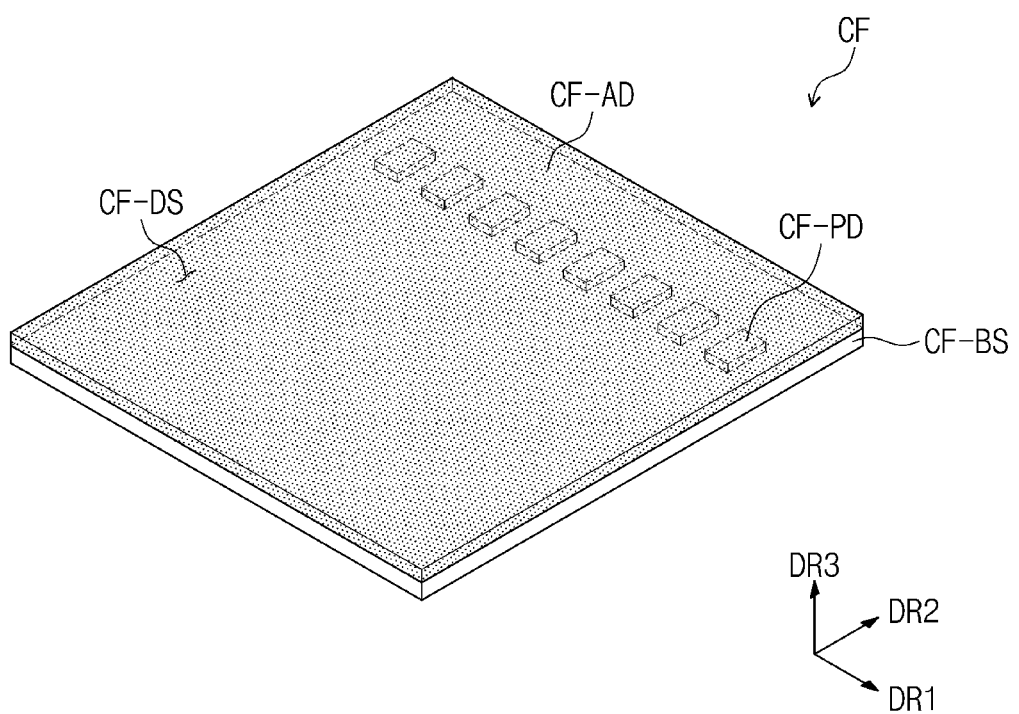
FIG. 8C is a perspective view of a circuit board according to an embodiment.

FIGS. 7A and 7B are perspective views of a circuit board CF according to some embodiments. FIG. 8A is a cross-sectional view taken along sectional line II-II' shown in FIG. 7B according to an embodiment. FIG. 8B is a cross-sectional view taken along sectional line II-II' shown in FIG. 7B according to an embodiment. FIG. 8C is a perspective view of a circuit board CF according to an embodiment.

The process of forming the circuit board CF shown in FIG. 6A will be described with reference to FIGS. 7A and 7B.

Referring to FIG. 7A, a base layer CF-BS of the circuit board CF is provided. A plurality of circuit pads CF-PD arranged in the first direction DR1 may be formed on the second pad area NDA-PC2 defined in the base layer CF-BS. Although, the circuit pads CF-PD are shown as being arranged in a single row, embodiments are not limited thereto, and the circuit pads CF-PD may be arranged in a plurality of rows.

Referring to FIG. 7B, a first resin layer CF-AD may be formed on the base layer CF-BS. According to some embodiments, the first resin layer CF-AD may be formed on the base layer CF-BS through at least one of a nozzle, inkjet, and printing transfer method. In addition, the first resin layer CF-AD may be provided as a carrier film type to be formed on the base layer CF-BS.

In a plan view, the first resin layer CF-AD may overlap between two adjacent circuit pads CF-PD of the circuit pads CF-PD and cover the side surfaces of the two circuit pads CF-PD facing in the first direction DR1. As illustrated in FIG. 7B, the first resin layer CF-AD may have a structure overlapping some of the entire area of the base layer CF-BS of the circuit board CF.

As shown in FIG. 7B, the circuit board CF defines the first area IA in which the first resin layer CF-AD is disposed on the base layer CF-BS and the second area INA in which the first resin layer CF-AD is non-overlapping on the base layer CF-BS. The first area IA may include a second pad area NDA-PC2. In the plan view, the first resin layer CF-AD may entirely surround the second pad area NDA-PC2 in which the circuit pads CF-PD are disposed. Further, according to some embodiments, the first area IA may have a smaller planar area than the second area INA.

For example, referring to FIG. 8A, the first resin layer CF-AD covers the circuit pads CF-PD as a whole and may be disposed on the base layer CF-BS. In this case, in the third direction DR3, each of the circuit pads CF-PD has a first thickness D1, and the first resin layer CF-AD may have a second thickness D2 greater than the first thickness D1.

As another example, referring to FIG. 8B, the first resin layer CF-AD may expose at least a portion of each of the circuit pads CF-PD. For instance, each of the circuit pads CF-PD may include a lower surface CF-PDS facing the base layer CF-BS and an upper surface CF-PDU opposite to the lower surface CF-PDS. At least one area of the upper surface CF-PDU of each of the circuit pads CF-PD may be exposed to the outside from the first resin layer CF-AD. In this manner, the first resin layer CF-AD in the third direction DR3 may have a thickness smaller than, equal to, or greater than the thickness DT of each of the circuit pads CF-PD depending on the thickness of the second resin layer AF-AD.

Referring to FIG. 8C, the first resin layer CF-AD may entirely overlap on the base layer CF-BS. For example, the first resin layer CF-AD may overlap the first area IA and the second area INA shown in FIG. 7B and may be formed on the base layer CF-BS. In this case, the first resin layer CF-AD may cover the circuit pads CF-PD as a whole or expose at least a portion of each of the circuit pads CF-PD to the outside.

Figure 9A:
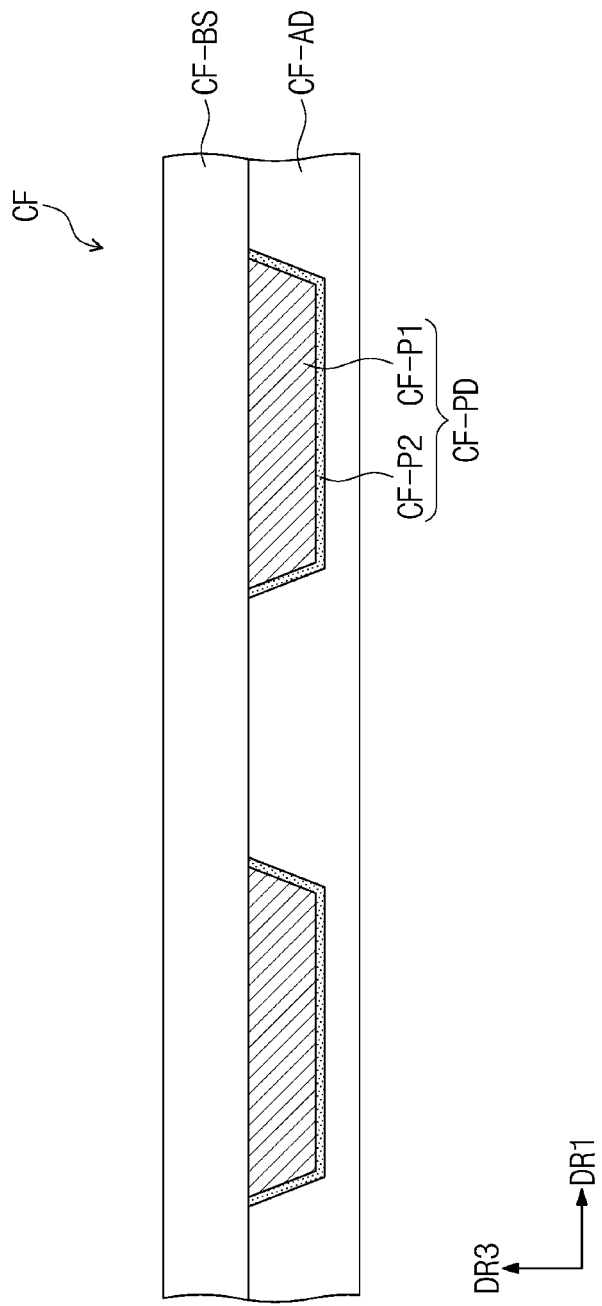
Figure 9C:
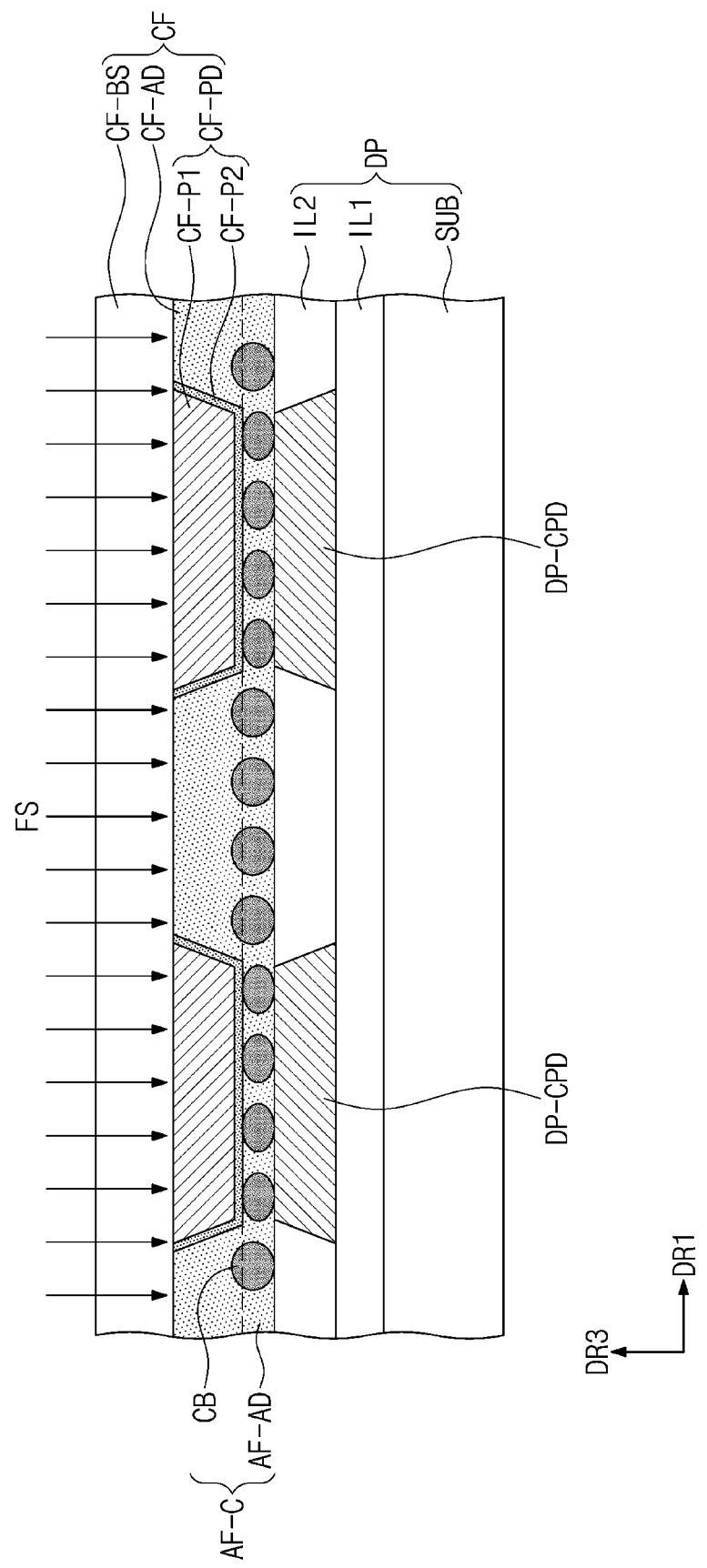

FIGS. 9A to 9C are views of a display device at various stages of manufacture according to an embodiment.

Referring to FIG. 9A, a circuit board CF including circuit pads CF-PD arranged along the first direction DR1 and a first resin layer CF-AD disposed between the circuit pads CF-PD is provided. As shown in FIG. 9A, although the first resin layer CF-AD covers the circuit pads CF-PD as a whole, the first resin layer CF-AD may expose at least a portion of each of the circuit pads CF-PD.

Referring to FIG. 9B, a display panel DP including driving pads DP-CPD respectively facing the circuit pads CF-PD is provided. The circuit pads CF-PD and driving pads DP-CPD may be arranged to face each other. A first conductive adhesive member AF-C may be disposed between the circuit pads CF-PD and the driving pads DP-CPD aligned with each other. The first conductive adhesive member AF-C may include a second resin layer AF-AD having a smaller thickness than the first resin layer CF-AD, as well as include conductive particles CB arranged in the first direction DR1 and sprayed on the second resin layer AF-AD.

According to some embodiments, before the circuit pads CF-PD and the driving pads DP-CPD are bonded, in the third direction DR3, the thickness of the second resin layer AF-AD may have a thickness of 0.5 times to 2.0 times the diameter of the first length DS of each individual one of the conductive particles CB.

After the circuit pads CF-PD and the driving pads DP-CPD are aligned, the first conductive adhesive member AF-C is provided, but embodiments are not limited thereto. As an example, after the first conductive adhesive member AF-C is provided, a process of aligning the circuit pads CF-PD and the driving pads DP-CPD may be performed. As another example, after the driving pads DP-CPD are provided, a first conductive adhesive member AF-C may be provided. Subsequently, a process in which the circuit pads CF-PD are provided to align with the driving pads DP-CPD may be performed and a process corresponding to the opposite may also be possible. Then, an operation of pressing any one of the circuit board CF and the display panel DP is performed. Through this process, the first resin layer CF-AD and the second resin layer AF-AD are made in contact with each other, and the circuit pads CF-PD and the driving pads DP-CPD may be electrically connected to each other through the conductive particles CB.

Thereafter, referring to FIG. 9C, an operation of curing the first resin layer CF-AD and the second resin layer AF-AD in contact with each other is performed. As illustrated in FIG. 9C, curing of the first resin layer CF-AD and the second resin layer AF-AD may be performed through an external element FS applied from the outside.

For example, the external element FS may be ultraviolet rays. In this case, each of the first resin layer CF-AD and the second resin layer AF-AD includes a photoinitiator and may be cured by ultraviolet rays emitted from the outside.

As another example, the external element FS may be external heat. In this case, each of the first resin layer CF-AD and the second resin layer AF-AD includes a thermal initiator and may be cured by heat applied from the outside.

According to various embodiments, the first resin layer CF-AD of the circuit board CF and the second resin layer AF-AD of the first conductive adhesive member AF-C may be cured through one process.

Figure 10A:
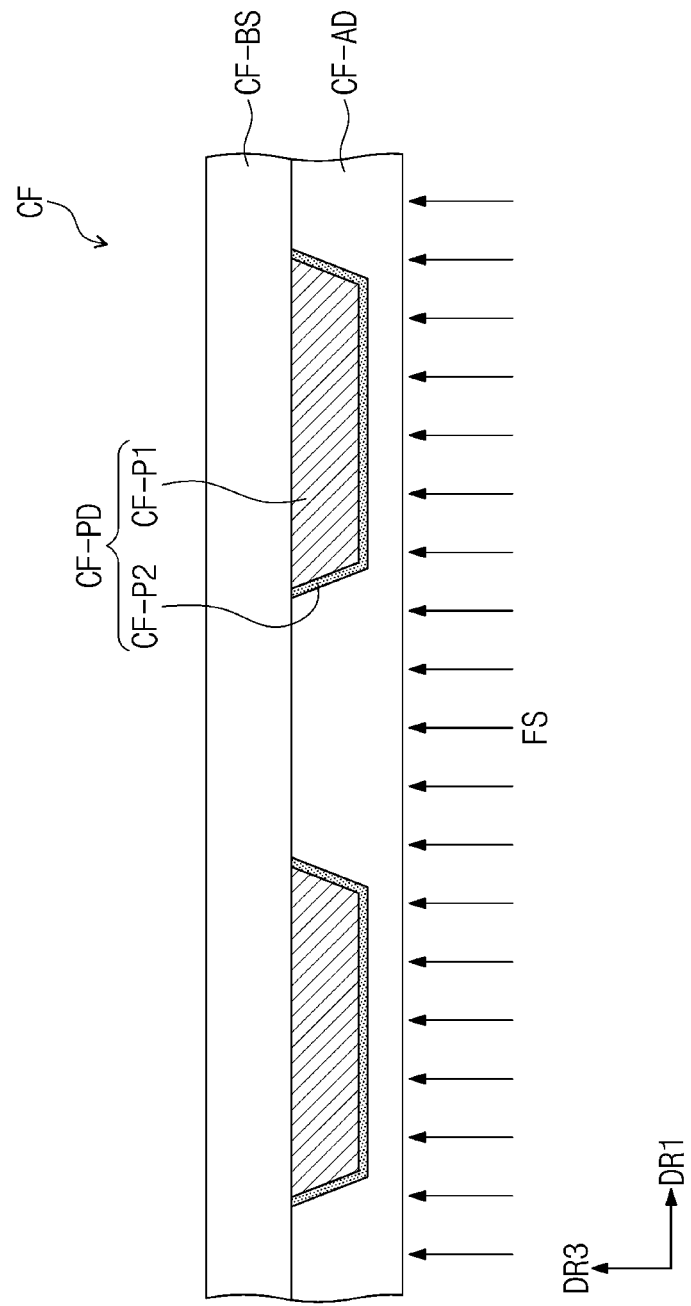
FIGS. 10A and 10B are views illustrating a display device at various stages of manufacture according to an embodiment.
Figure 10B:
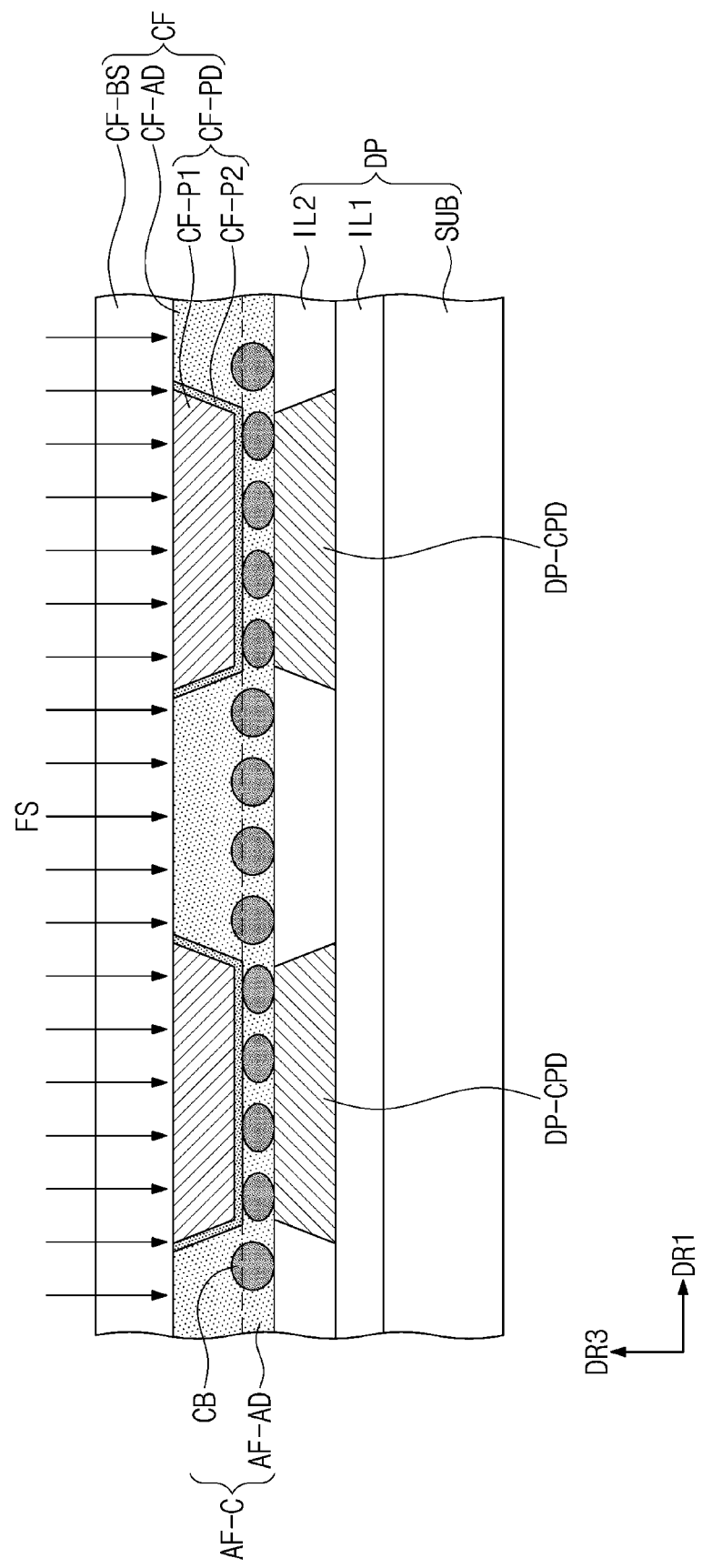

FIGS. 10A and 10B are views illustrating a display device at various stages of manufacture according to an embodiment.

Referring to FIG. 10A, before the bonding process between the circuit board CF and the display panel DP, curing of the first resin layer CF-AD of the circuit board CF may proceed in advance. In this case, the first resin layer CF-AD may be cured by ultraviolet rays or external heat.

Referring to FIG. 10B, a process between the circuit board CF including the first resin layer CF-AD on which curing is processed and the display panel DP may be performed. In this case, through the conductive particles CB of the first conductive adhesive member AF-C, the process of electrically bonding the circuit pads CF-PD and the driving pads DP-CPD is performed. Then, after the second resin layer AF-AD is in contact with the first resin layer CF-AD, curing of the second resin layer AF-AD included in the first conductive adhesive member AF-C may proceed.

The curing process of the second resin layer AF-AD may be performed later than the curing process of the first resin layer CF-AD. As a result, the curing process of the second resin layer AF-AD may be performed through the same process method as the curing process of the first resin layer CF-AD or may be performed through another process method.

Figure 11A:
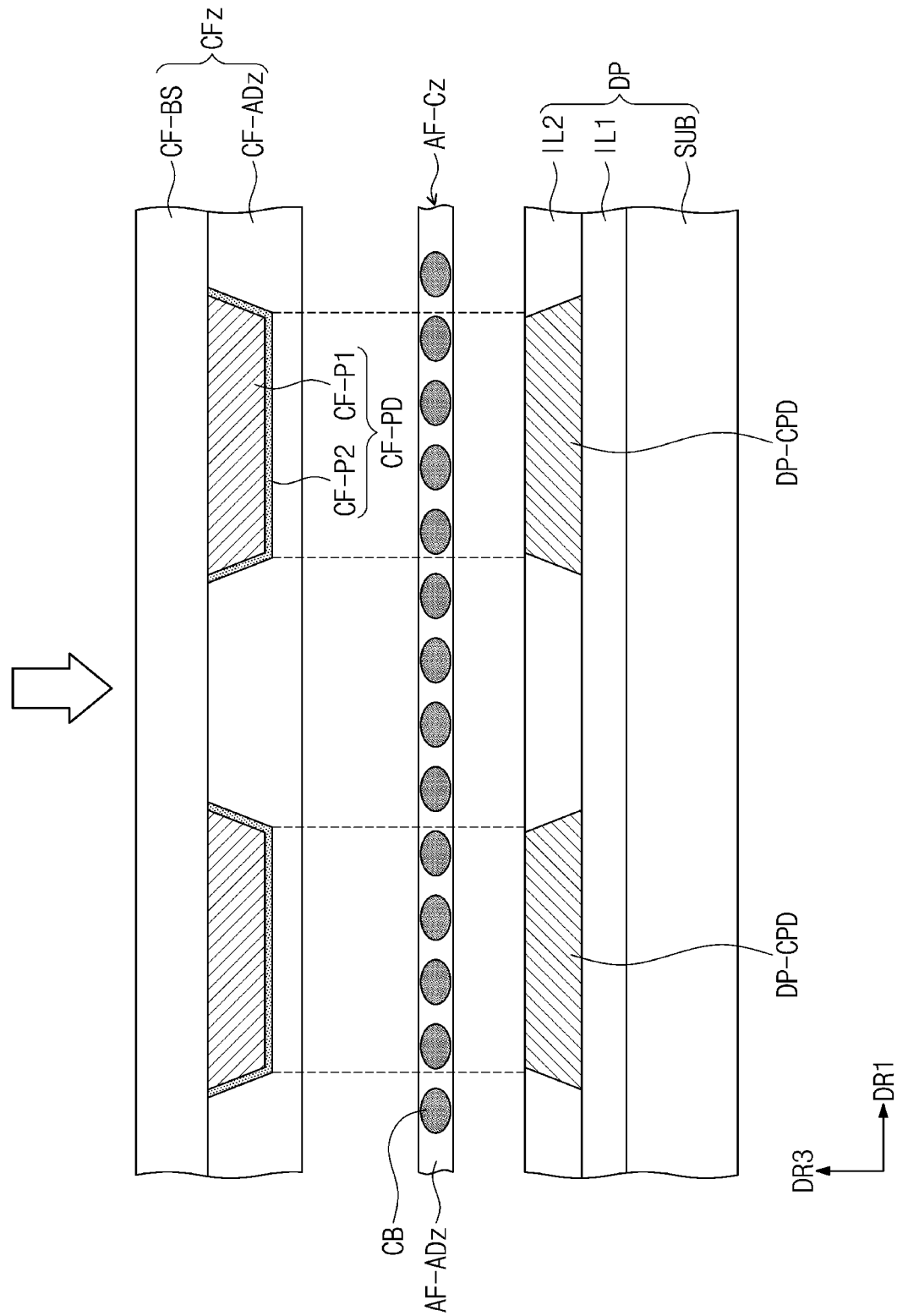
FIGS. 11A, 11B, and 11C are views illustrating a display device at various stages of manufacture according to an embodiment.
Figure 11B:
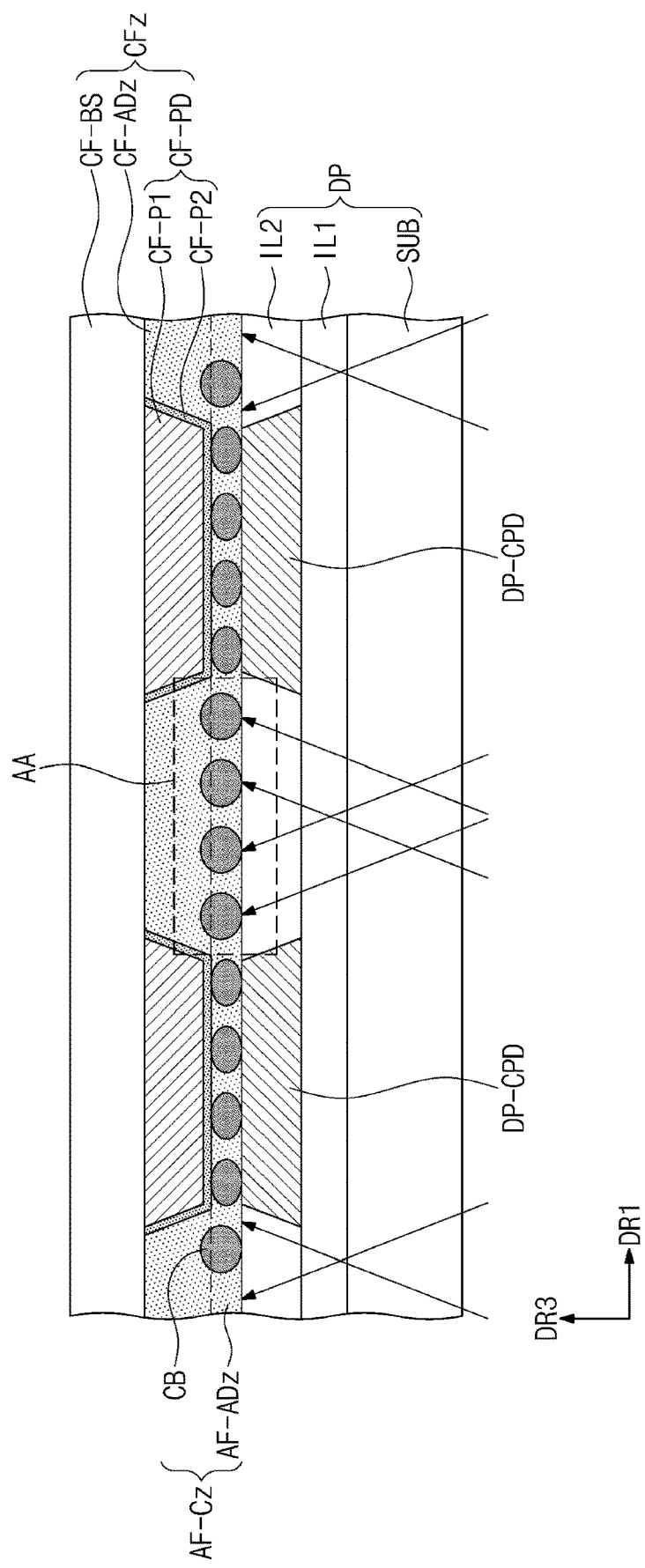
Figure 11C:
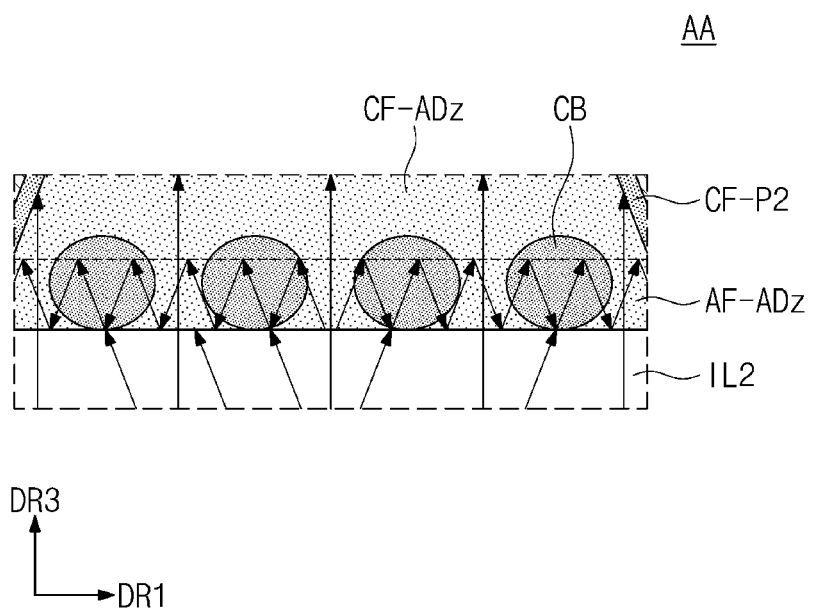

FIGS. 11A to 11C are views illustrating a display device at various stages of manufacture according to an embodiment.

First, referring to FIG. 11A, the circuit board CFz may include a first resin layer CF-ADz having a first refractive index as compared with the circuit board CF shown in FIG. 9B. In addition, the remaining components of the circuit board CFz may substantially correspond to the remaining components of the circuit board CF shown in FIG. 9B.

In addition, the first conductive adhesive member AF-Cz may include a second resin layer AF-ADz having a second refractive index as compared to the first conductive adhesive member AF-C shown in FIG. 9B. In addition, the remaining components of the first conductive adhesive member AF-Cz may substantially correspond to the remaining components of the first conductive adhesive member AF-C shown in FIG. 9B.

According to an embodiment, the first refractive index of the first resin layer CF-ADz may be lower than the second refractive index of the second resin layer AF-ADz. As the first refractive index of the first resin layer CF-ADz is lower than the second refractive index of the second resin layer AF-ADz, total reflection may occur at an interface between the first resin layer CF-ADz and the second resin layer AF-ADz. In this case, external ultraviolet rays may be incident on the second resin layer AF-ADz.

Each of the first resin layer CF-ADz and the second resin layer AF-ADz may include a photoinitiator. According to an embodiment, the first resin layer CF-ADz may be cured by ultraviolet rays irradiated from the outside before bonding with the first conductive adhesive member AF-Cz. As such, the first resin layer CF-ADz may be cured before the second resin layer AF-ADz.

Referring to FIG. 11B, an operation of pressing any one of the circuit board CF and the display panel DP is performed. Through this, the first resin layer CF-ADz and the second resin layer AF-ADz are made in contact with each other, and the circuit pads CF-PD and the driving pads DP-CPD may be electrically connected to each other through the conductive particles CB.

Then, an operation of curing the second resin layer AF-ADz proceeds. As illustrated in FIG. 11B, ultraviolet rays passing through a lower portion of the display panel DP may be irradiated to the second resin layer AF-ADz. FIG. 11C is an enlarged view of area AA illustrated in FIG. 11B according to an embodiment. Referring to FIG. 11C, as the second refractive index of the second resin layer AF-ADz is greater than the first refractive index of the first resin layer CF-ADz, total reflection may occur at the interface between the second resin layer AF-ADz and the first resin layer CF-ADz. For example, a part of the ultraviolet rays transmitted through the second resin layer AF-ADz may be reflected by the first resin layer CF-ADz or may pass through the first resin layer CF-ADz. As described above, ultraviolet rays may be totally reflected from the first resin layer CF-Adz, and then irradiated on the second resin layer AF-ADz. As a result, the curing efficiency of the second resin layer AF-ADz can be improved.

As another example, ultraviolet rays incident on the second resin layer AF-ADz may pass through the second resin layer AF-ADz and the first resin layer CF-ADz. For instance, when ultraviolet rays is irradiated to the second resin layer AF-ADz in a direction parallel to the third direction DR3, ultraviolet rays may not generate total reflection at the interface between the second resin layer AF-ADz and the first resin layer CF-ADz.

Although an embodiment in which the first resin layer CF-ADz is cured previously and then the second resin layer AF-ADz is cured is described with reference to FIGS. 11A to 11C, embodiments are not limited thereto. For example, as illustrated in FIG. 11C, the second resin layer AF-ADz and the first resin layer CF-ADz may be simultaneously cured by ultraviolet rays. In this case, ultraviolet rays irradiated on the lower portion of the display panel DP may not cause total reflection at the interface between the second resin layer AF-ADz and the first resin layer CF-ADz or may pass through the second resin layer AF-ADz and the first resin layer CF-ADz. Accordingly, curing of the second resin layer AF-ADz and the first resin layer CF-ADz may be simultaneously performed.

According to an embodiment, a circuit board may be provided with a structure including a first resin layer disposed between circuit pads, and a conductive adhesive member may be provided in a structure including a second resin layer in which conductive particles are dispersed. As the circuit pads of the circuit board and the driving pads of the display panel are each bonded, the first resin layer and the second resin layer may contact each other. Thereafter, as curing of the first resin layer and the second resin layer progresses through one process, the overall process speed and process efficiency of the display device may be improved.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
   a display panel comprising a substrate including a display area and a non-display area adjacent to the display area, pixels on the display area, a driving circuit on the non-display area, and driving pads on the non-display area, and the pixels and the driving circuit connected to driving pads;
   a circuit board overlapping the non-display area and connected to the display panel, the circuit board comprising a base layer comprising a pad area and circuit pads overlapping the pad area and disposed on the base layer, the circuit pads being spaced apart from each other in a plan view and arranged in a direction; and
   a conductive adhesive member disposed between the circuit board and the display panel, the conductive adhesive member electrically connecting the circuit pads and the driving pads, wherein:
   the conductive adhesive member comprises:
   a first resin layer overlapping the pad area and disposed on the base layer;
   a second resin layer disposed between the first resin layer and the display panel; and
   conductive particles in the second resin layer, the conductive particles electrically connecting the circuit board and the display panel; and
   in a plan view, the first resin layer overlaps an area between two adjacent circuit pads among the circuit pads and covers side surfaces of the two adjacent circuit pads facing in the direction;
   the driving pads are exposed from an insulating layer on the substrate and overlap the display area and the non-display area;
   the first resin layer and the second resin layer consist of an adhesive resin, and the second resin layer is in direct contact with the first resin layer and the insulating layer,
   wherein the circuit pads include a first circuit pad disposed on the base layer and a second circuit pad covering the first circuit pad, and
   wherein the second resin layer has a thickness of 0.5 times or more and 2.0 times or less than a diameter length of each of the conductive particles.

2. The display device of claim 1, wherein:
   at least one of the conductive particles penetrates the second resin layer.

3. The display device of claim 2, wherein:
   each of the first resin layer and the second resin layer comprises a photoinitiator; and
   a refractive index of the second resin layer is greater than a refractive index of the first resin layer.

4. The display device of claim 2, wherein:
   each of the circuit pads comprises a lower surface facing the base layer and an upper surface facing the lower surface; and
   the lower surface of each of the circuit pads respectively contacts corresponding conductive particles among the conductive particles.

5. The display device of claim 2, wherein in a thickness direction of the base layer, a thickness of the first resin layer is greater than a thickness of the second resin layer.

6. The display device of claim 2, wherein:
   the first resin layer surrounds the pad area in a plan view, and
   the base layer further comprises an area adjacent to the pad area and exposed by the first resin layer.

7. The display device of claim 6, wherein a planar area of the area exposed by the first resin layer is greater than a planar area of the first resin layer.

8. The display device of claim 1, wherein the first resin layer entirely overlaps the base layer.

9. The display device of claim 1, wherein the first resin layer comprises a thermal initiator or a photoinitiator.

10. The display device of claim 1, wherein at least a portion of the second circuit pad is disposed on the base layer.

11. The display device of claim 1, wherein the second circuit pad has a smaller thickness than the first circuit pad.

12. The display device of claim 1, wherein the first circuit pad is copper and the second circuit pad is tin.

* * * * *